United States Patent
Tseng et al.

(10) Patent No.: US 10,424,517 B2
(45) Date of Patent: Sep. 24, 2019

(54) METHOD FOR MANUFACTURING A DUAL WORK FUNCTION SEMICONDUCTOR DEVICE AND THE SEMICONDUCTOR DEVICE MADE THEREOF

(71) Applicant: Taiwan Semiconductor Manufacturing Company, Ltd., Hsin-Chu (TW)

(72) Inventors: Joshua Tseng, Tervuren (BE); Yasutoshi Okuno, Osaka (JP); Lars-Ake Ragnarsson, Leuven (BE); Tom Schram, Rixensart (BE); Stefan Kubicek, Pellenberg (BE); Thomas Y Hoffman, Leuven (BE); Naohisa Sengoku, Osaka (JP)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/180,313

(22) Filed: Jun. 13, 2016

(65) Prior Publication Data

US 2016/0365289 A1 Dec. 15, 2016

Related U.S. Application Data

(63) Continuation of application No. 12/684,803, filed on Jan. 8, 2010, now abandoned.
(Continued)

(51) Int. Cl.
*H01L 21/8238* (2006.01)
*H01L 21/28* (2006.01)
(Continued)

(52) U.S. Cl.
CPC ........... *H01L 21/823842* (2013.01); *H01L 21/28185* (2013.01); *H01L 21/28194* (2013.01);
(Continued)

(58) Field of Classification Search
CPC ............ H01L 29/66545; H01L 27/092; H01L 29/517; H01L 29/4966; H01L 21/823842;
(Continued)

(56) References Cited

U.S. PATENT DOCUMENTS 6,645,882 B1 * 11/2003 Halliyal ............ H01L 21/28185
257/E21.271
6,790,755 B2 9/2004 Jeon
(Continued)

OTHER PUBLICATIONS

Gunawan et al., "Optimal control of rapid thermal annealing in a semicodnuctor process", Journal of Process Control, 14 (2004) 423-430.*
(Continued)

*Primary Examiner* — Meiya Li
(74) *Attorney, Agent, or Firm* — Haynes and Boone, LLP

(57) ABSTRACT

A method for manufacturing a dual work function semiconductor device includes forming a first silicon oxide layer on a substrate and forming a first hafnium-containing dielectric material layer on the first silicon oxide layer. The method further includes forming an aluminum-containing dielectric material layer on the first hafnium-containing dielectric material layer and performing a thermal treatment to intermix the silicon oxide layer, the first hafnium-containing dielectric material layer and the aluminum-containing dielectric material layers. This results in an intermixing dielectric layer containing hafnium, aluminum, silicon, and oxygen. The method further includes forming a first metal-containing conductive layer on the intermixing dielectric layer and patterning the first metal-containing conductive layer
(Continued)

layer and the intermixing dielectric layer, thereby forming a first gate stack in a first region.

20 Claims, 30 Drawing Sheets

Related U.S. Application Data

(60) Provisional application No. 61/143,696, filed on Jan. 9, 2009.

(51) Int. Cl.
    *H01L 29/49*      (2006.01)
    *H01L 29/51*      (2006.01)
    *H01L 21/324*      (2006.01)
    *H01L 27/092*      (2006.01)
    *H01L 29/06*      (2006.01)

(52) U.S. Cl.
CPC .... *H01L 21/324* (2013.01); *H01L 21/823857* (2013.01); *H01L 27/092* (2013.01); *H01L 29/0649* (2013.01); *H01L 29/495* (2013.01); *H01L 29/513* (2013.01); *H01L 29/517* (2013.01); *H01L 29/4966* (2013.01)

(58) Field of Classification Search
CPC ......... H01L 27/0922; H01L 21/823828; H01L 27/088; H01L 21/823462; H01L 29/78; H01L 21/823857; H01L 21/823437; H01L 29/401

See application file for complete search history.

(56) References Cited

U.S. PATENT DOCUMENTS

| | | | |
|---|---|---|---|
| 2004/0023478 A1* | 2/2004 | Samavedam | ... H01L 21/823814 438/592 |
| 2005/0280104 A1 | 12/2005 | Li | |
| 2006/0118879 A1 | 6/2006 | Li | |
| 2007/0004154 A1 | 1/2007 | Hong et al. | |
| 2009/0152650 A1* | 6/2009 | Chudzik | ........... H01L 21/28123 257/410 |
| 2009/0311877 A1* | 12/2009 | Olsen | .................. H01L 21/0223 438/770 |
| 2010/0219481 A1 | 9/2010 | Tseng et al. | |

OTHER PUBLICATIONS

Cho et al., "Interfacial reaction depending on the stack structure of Al2O3 and HfO2 during film growth and postannealing," Applied Physics Letters, vol. 85, #18, Nov. 2004, p. 4115-4117.

Chang et al., "Electrical properties of low-Vt metal-gated n-MOSFETs using La2O3/SiOx as interfacial layer between HfLaO high-k dielectrics and Si channel," IEEE Elec. Dev. Lett., vol. 29, No. 5, May 2008, p. 430-433.

* cited by examiner

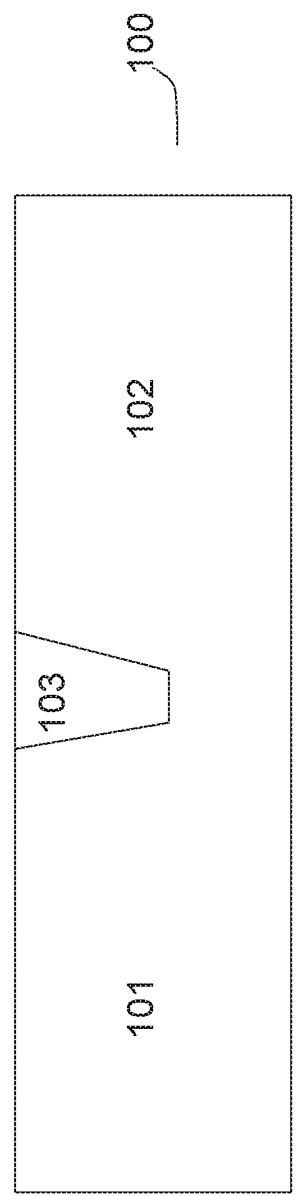
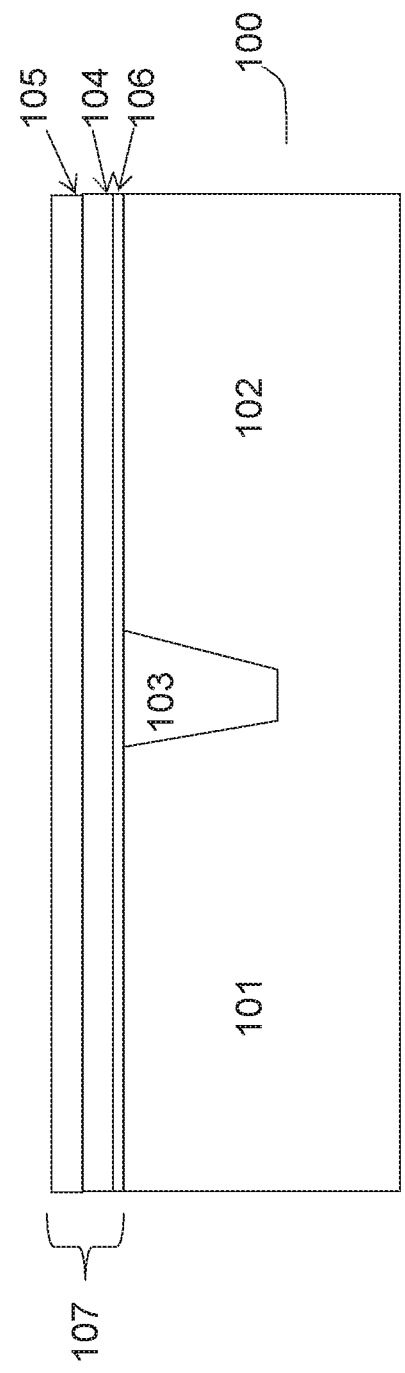

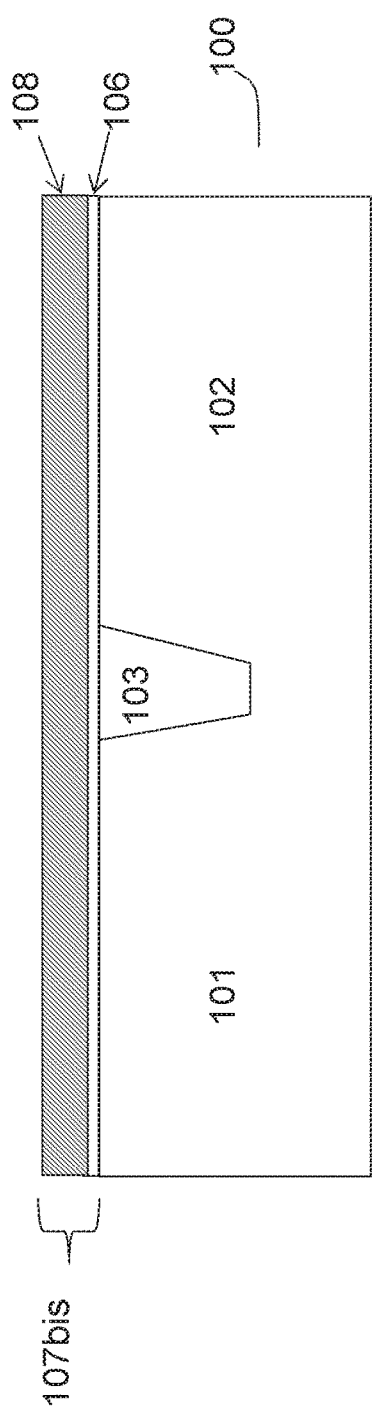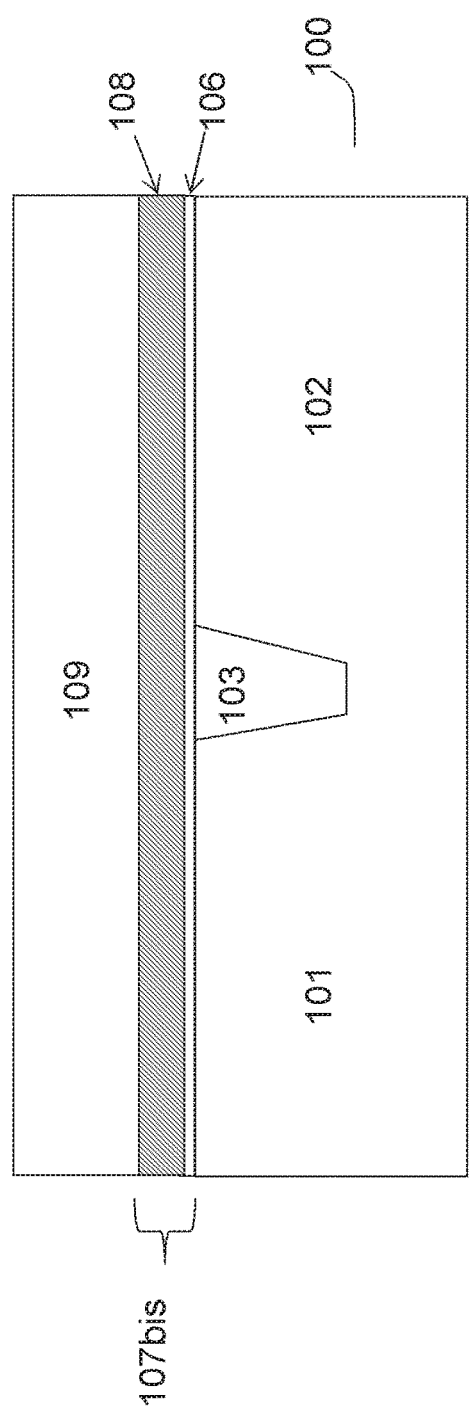

METHOD FOR MANUFACTURING A DUAL WORK FUNCTION SEMICONDUCTOR DEVICE AND THE SEMICONDUCTOR DEVICE MADE THEREOF

CROSS REFERENCE TO RELATED APPLICATIONS

This application claims priority to U.S. provisional patent application 61/143,696 filed on Jan. 9, 2009 and to U.S. application Ser. No. 12/684,803 filed on Jan. 8, 2010, which applications are hereby incorporated by reference in their entirety.

BACKGROUND OF THE INVENTION

1. Field of the Invention

The present invention generally relates to methods for manufacturing semiconductor devices. More particularly, this invention relates to methods for manufacturing semiconductor devices having dual work function and to semiconductor devices made thereof.

2. Description of the Related Technology

Up to now, semiconductor industry remains driven by scaling geometric dimensions of metal-oxide-semiconductor field-effect-transistors (MOSFETs). With traditional MOSFET-technology, using silicon dioxide ($SiO_2$) as gate dielectric and polycrystalline silicon (poly-Si) as gate material, a lot of problems occur when scaling down to 100 nm or below.

As the gate dielectric thickness is reduced, an exponential increase of gate direct tunneling currents occurs. One solution to solve this problem for a 45 nm technology node and beyond is the introduction of so-called high-k dielectrics as gate dielectric. A high-k dielectric is a dielectric featuring a dielectric constant (k) higher than the dielectric constant of $SiO_2$, i.e. k>3.9. High-k dielectrics allow for a larger physical thickness (compared to $SiO_2$) for obtaining a same effective capacitance than can be obtained with a much thinner $SiO_2$ layer. The larger physical thickness of the high-k material reduces gate leakage currents.

For $SiO_2$ oxide thicknesses below 2 nm, a polysilicon (poly-Si) depletion effect starts to become dominant in the poly-Si gate. A solution to this problem is the introduction of metals as gate material. Advantages of metal gates are elimination of the polysilicon depletion effect, very low resistance, no dopant penetration possible and better compatibility with high-k gate dielectrics.

By introducing metal gates, the threshold voltage of the MOSFET becomes controlled by the metal work function. Regarding metal gate electrodes, tuning of the work function is not straightforward as a different work function is needed for NMOS than for PMOS. This requires now a (n-type) metal (replacing poly-Si) that works for nMOSFET (i.e. a work function preferably between about 3.9 eV and about 4.4 eV) and a (p-type) metal that works for pMOSFET (i.e. a work function preferably between about 4.8 eV and about 5.2 eV). Whereas the work function of a polysilicon gate electrode can be tuned by ion implantation, the work function of a metal gate electrode is a material property which cannot be changed easily.

It has been proven difficult to identify band-edge metals (metals with either a n-type or a p-type work function (WF), required for low device voltage threshold, $V_t$) that are compatible with the conventional complementary metal oxide semiconductor (CMOS) fabrication process. CMOS can be made using dual metal gates with single or dual dielectrics. In either case, a selective removal of one of the metal gates is necessary and adds substantial complexity and costs to the manufacturing process. Moreover, after the selective removal process, the interface between the underlying dielectric layer and the metal electrode is often modified, due to the presence of undesired dangling bonds. This modification may influence the effective work function of the gate stack in an unwanted way.

A major challenge of implementing high-k gate dielectrics and metal gates in CMOS devices is the PMOS effective work function roll-off phenomena in the low equivalent oxide thickness (EOT) region. It remains difficult to achieve PMOS band-edge work functions for low EOT (i.e. below 1.5 nm).

There is a need for simplified integration schemes for high-k/metal gate semiconductor devices and more specifically for simplified dual work function semiconductor device integration schemes, for example for dual work function CMOS devices.

SUMMARY OF CERTAIN INVENTIVE ASPECTS

In certain inventive aspects, methods are disclosed to form a semiconductor device with dual work function, more specifically for example a CMOS device with dual work function, the methods providing a simplified process flow with reduced number of process steps.

One inventive aspect relates to a method for manufacturing a dual work function semiconductor device, the method comprising defining at least a first region and at least a second region in a substrate, the first region being electrically isolated from the second region. The method further comprises forming a first transistor in the first region, the first transistor having a first effective work function. The method comprises, after forming the first transistor, forming a second transistor in the second region having a second effective work function being different from the first effective work function.

The process of forming the first transistor comprises providing a first gate dielectric stack on the substrate, the first gate dielectric stack comprising a first gate dielectric layer and a first gate dielectric capping layer on and in contact with the first gate dielectric layer; thereafter performing a thermal treatment of the first gate dielectric stack so as to modify the first gate dielectric stack, the modified first gate dielectric stack defining the first effective work function; thereafter providing a first metal gate electrode layer on the modified first gate dielectric stack; patterning the first metal gate electrode layer and the modified first gate dielectric stack.

In accordance with embodiments of certain inventive aspects, the thermal treatment of the first gate dielectric stack induces intermixing of the first gate dielectric layer and the first gate dielectric capping layer.

In accordance with embodiments of certain inventive aspects, the thermal treatment comprises an annealing process. The annealing process may be performed at a temperature range in between 800 degrees Celsius and 1300 degrees Celsius. The annealing process may be performed during a time period in the range of 0.1 second to 30 seconds. In a particular embodiment of certain inventive aspects, the thermal treatment is performed at a temperature of 1000 degrees Celsius during 1 second up to 30 seconds. The thermal treatment may be a post deposition annealing process (PDA). The thermal treatment must be performed after the process of providing the first gate dielectric capping layer but before the process of providing the first metal gate electrode layer.

The annealing process may be a spike annealing or laser annealing or rapid thermal annealing process.

The thermal treatment may be performed in a low oxygen ambient such as for example $N_2$ or Ar.

According to embodiments of certain inventive aspects a first gate stack comprises the modified first gate dielectric stack and the first metal gate electrode, wherein the effective work function of the first gate stack in particular embodiments is in the range of 4.7 eV to 5.2 eV.

According to embodiments certain inventive aspects, forming a second transistor in the second region comprises forming a second gate stack in the second region, the second gate stack comprising a second gate dielectric stack and a second metal gate electrode, wherein the effective work function of the second gate stack in particular embodiments is in the range of 4.0 eV to 4.5 eV. The second gate dielectric stack comprises a second gate dielectric layer and a second gate dielectric capping layer.

The first and second gate dielectric layer may comprise the same material.

The first and second gate dielectric capping layers in particular embodiments comprise different materials. The first gate dielectric capping layer may comprise an aluminium-based dielectric. The second gate dielectric capping layer may comprise a lanthanide-based dielectric.

The first gate dielectric stack has an initial effective oxide thickness (EOTinit) and the modified first gate dielectric stack has a modified effective oxide thickness (EOTmod), wherein the difference between EOTmod and EOTinit is smaller than 30 percent.

In a particular aspect of a method for manufacturing a dual work function semiconductor device according to embodiments of certain inventive aspects, the method comprises defining at least a PMOS region and at least a NMOS region in a substrate, the PMOS region being electrically isolated from the NMOS region. The method further comprises forming a PMOS transistor in the PMOS region having a PMOS work function. The method further comprises after forming the PMOS transistor, forming a NMOS transistor in the NMOS region having a NMOS work function being different from the PMOS work function. The process of forming the PMOS transistor comprises: [0025] providing a first gate dielectric stack on the substrate, the first gate dielectric stack comprising a Hf-containing gate dielectric layer and an Al-containing gate dielectric capping layer on and in contact with the Hf-containing gate dielectric layer;

thereafter performing a thermal treatment of the first gate dielectric stack as such modifying the first gate dielectric stack, the modified first gate dielectric stack defining the PMOS work function;

thereafter providing a PMOS metal gate electrode layer on the modified first gate dielectric stack;

patterning the PMOS metal gate electrode layer and modified first gate dielectric stack The thermal treatment of the first gate dielectric stack induces intermixing of the Hf-containing gate dielectric layer and the Al-containing gate dielectric capping layer.

In one inventive aspect, the effective work function may be tuned for both PMOS and NMOS of a semiconductor device without substantially increasing the effective oxide thickness (EOT).

BRIEF DESCRIPTION OF THE FIGURES

The drawings are intended to illustrate some aspects and embodiments of certain inventive aspects. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein be considered illustrative rather than restrictive. In the different figures, the same reference signs refer to the same or analogous elements.

FIG. 1 to FIG. 9 represent different schematic cross-sections of a semiconductor device corresponding to several process steps according to embodiments of the certain inventive aspects of a method for manufacturing a dual work function semiconductor device.

DETAILED DESCRIPTION OF CERTAIN ILLUSTRATIVE EMBODIMENTS

Figure 3:
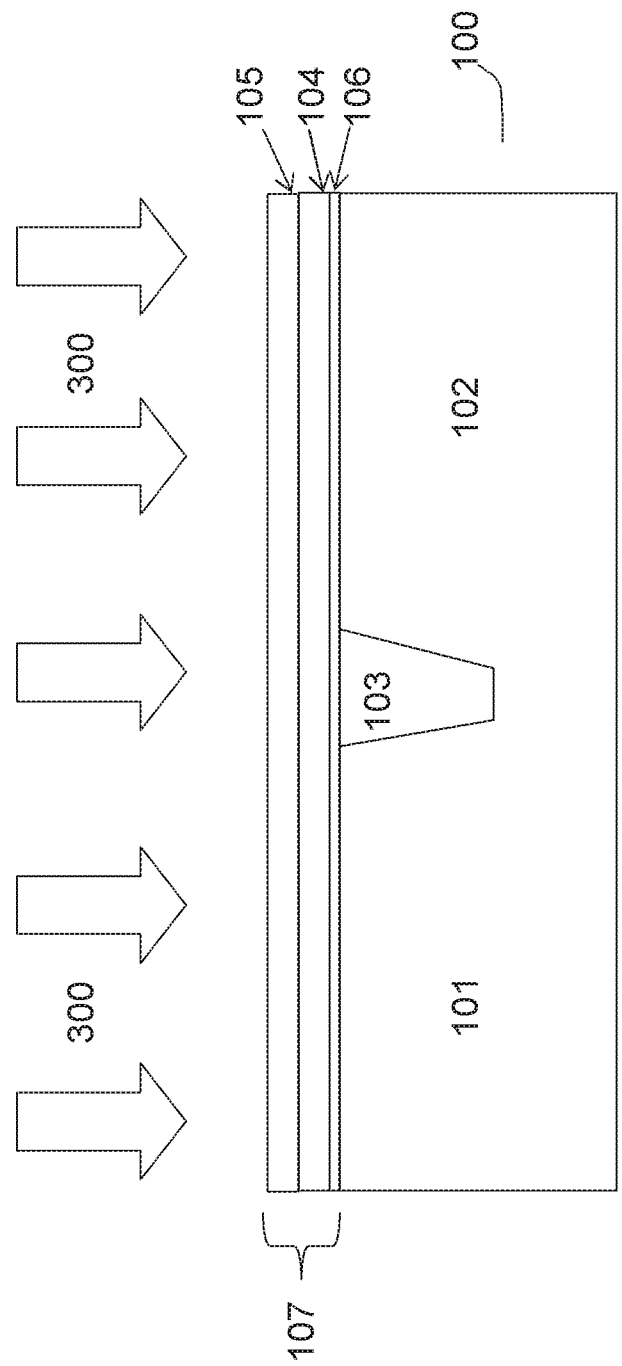

One or more embodiments of certain inventive aspects will now be described in detail with reference to the attached figures; however, the invention is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope as defined by the appended claims. Accordingly, the description of preferred embodiments should not be deemed to limit the scope of the present invention.

Furthermore, the terms first, second and the like in the description are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

It is to be noticed that the term "comprising" should not be interpreted as being restricted to the means listed thereafter; it does not exclude other elements or processes. Thus, the scope of the expression "a device comprising means A and B" should not be limited to devices consisting only of components A and B. It means that with respect to the present description, the only relevant components of the device are A and B.

Various embodiments of the invention are referring to parameters of the semiconductor device such as threshold voltage ($V_t$), effective work function (EWF), or physical characteristics of the material(s) employed such as work function (WF), Fermi level etc. The definitions as used through this document are summarized herein below.

In the MOSFET device, the gate requires a threshold voltage ($V_t$) to render the channel conductive. Complementary MOS (CMOS) processes fabricate both n-channel and p-channel (respectively NMOS and PMOS) transistors. The difference of the threshold voltage $V_t$, i.e. the difference of the threshold voltage between the NMOS and PMOS transistor, is influenced by what is called the difference of the effective work function (.DELTA.EWF). The difference of the effective work function is the difference between the effective work function of the NMOS transistor and the effective work function of the PMOS transistor. To establish threshold voltage ($V_t$) values for the PMOS transistor and NMOS transistor respectively, the effective work function difference of the respective PMOS and NMOS gate materials (gate stacks) and their corresponding channel regions is independently established through channel processing and gate processing. In other words, both gate dielectric (comprising i.e. a host dielectric and optionally different capping layers) and gate electrode (comprising at least one metal layer) determine the effective work function (EWF) of the gate stack (device). Moreover, the gate processing itself (i.e. the sequence of the different steps and/or the thermal treatments applied) may have an influence on the effective work function (EWF) of the gate stack (device).

The effective work function (EWF) of a gate stack (device) is a parameter that can be tuned by the choice of the gate dielectric materials, gate electrode materials and by the gate processing performed. On the contrary, the work function (WF) of the gate electrode (often referred to as metal gate electrode MG or metal layer electrode or metal control electrode) is an intrinsic property of the material. In general, the work function of a certain material is a measure of the energy, in electron volts (eV), required to eject an electron in the material out of a material atom to the vacuum, if the electron were initially at the Fermi level. The work function of the gate electrode may also be referred to as as-deposited work function or the intrinsic work function of the material.

For a silicon substrate, the gate electrode of a negative channel MOSFET (or NMOS) device would have an n-type work function of approximately 4.1 eV (+/−0.3 eV), and the gate electrode of a positive channel MOSFET (or PMOS) device would have a p-type work function of approximately 5.2 eV (+/−0.3 eV).

A high-k (HK) dielectric is a dielectric featuring a dielectric constant (k) higher than the dielectric constant of $SiO_2$, i.e. k>3.9. High-k dielectrics allow for a larger physical thickness (compared to $SiO_2$) for obtaining a same effective capacitance than can be obtained with a much thinner $SiO_2$ layer.

In the following certain embodiments will be described with reference to a silicon (Si) substrate but it should be understood that the invention applies equally well to other types of semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

One embodiment relates generally to a method for manufacturing a dual work function semiconductor device, the method comprising:

defining at least a first region and at least a second region in a substrate, the first region being electrically isolated from the second region forming a first transistor in the first region having a first effective work function wherein forming the first transistor comprises providing a first gate dielectric stack on the substrate, the first gate dielectric stack comprising a first gate dielectric layer and a first gate dielectric capping layer on and in contact with the first gate dielectric layer;

thereafter performing a thermal treatment of the first gate dielectric stack so as to modify the first gate dielectric stack, the modified first gate dielectric stack defining the first effective work function;

thereafter providing a first metal gate electrode layer on the modified first gate dielectric stack;

patterning the first metal gate electrode layer and modified first gate dielectric stack after forming the first transistor, forming a second transistor in the second region having a second effective work function being different from the first effective work function.

One embodiment relates more specifically to a method for manufacturing a dual work function semiconductor CMOS device, the method comprising defining at least a PMOS region and at least a NMOS region in a substrate, the PMOS region being electrically isolated from the NMOS region;

forming a PMOS transistor in the PMOS region having a PMOS work function wherein forming the PMOS transistor comprises providing a first gate dielectric stack on the substrate, the first gate dielectric stack comprising a Hf-containing gate dielectric layer and an Al-containing gate dielectric capping layer on and in contact with the Hf-containing gate dielectric layer;

thereafter performing a thermal treatment of the first gate dielectric stack so as to modify the first gate dielectric stack, the modified first gate dielectric stack defining the PMOS work function;

thereafter providing a PMOS metal gate electrode layer on the modified first gate dielectric stack;

patterning the PMOS metal gate electrode layer and modified first gate dielectric stack after forming the PMOS transistor, forming a NMOS transistor in the NMOS region having a NMOS work function being different from the PMOS work function.

With reference now to FIG. 1 to FIG. 7 and FIG. 33, different process steps for a method of manufacturing a dual work function semiconductor device according to an aspect of the present invention is described in more detail.

FIG. 1 illustrates a semiconductor substrate 100, e.g. a silicon substrate. The substrate 100 may comprise multiple distinct regions. In particular embodiments, two distinct regions may be defined in the substrate 100, as is illustrated in FIG. 1: a first region 101 and a second region 102. The first region 101 may also be referred as the first active region of the device and the second region 102 may also be referred as the second active region of the device. The first region 101 and the second region 102 may be electrically isolated from each other by an insulating region 103. A possible way to isolate the first 101 and second 102 region from each other is by using shallow trench isolation (STI) in between both regions 101, 102. STI is a deep narrow trench, etched into the semiconductor substrate in between adjacent devices in an integrated circuit and filled with dielectric material such as oxide, to provide electrical isolation between the adjacent devices. Alternatively, local oxidation of silicon (LOCOS) may be used for isolating the first and the second regions 101, 102 from each other.

A first gate stack will be formed in the first region 101, the first gate stack being for example part of a PMOS transistor (and thus the first region 101 representing a PMOS region for forming a PMOS transistor). A second gate stack will be formed in the second region 102, the second gate stack being for example part of a NMOS transistor (and thus the second region 102 representing a NMOS region for forming a NMOS transistor). It should be understood that the invention is not limited thereto and NMOS and PMOS may be interchanged, i.e. forming a first NMOS transistor in the first (NMOS) region and a second PMOS transistor in the second (PMOS) region.

According to particular embodiments of the present invention the first region defines a PMOS region and the second region defines a NMOS region.

After providing the first region 101 and the second region 102 a stack of layers 107 is provided on the semiconductor substrate 100 in both the first region 101 and the second region 102 (FIG. 2). The stack of layers 107 defines a gate dielectric stack. The gate dielectric stack 107 comprises a gate dielectric layer 104 and a gate dielectric capping layer 105. The gate dielectric capping layer 105 is formed in contact with the gate dielectric layer 104. Optionally the gate dielectric stack 107 also comprises an interfacial dielectric layer 106 (e.g. $SiO_2$) between the substrate 100 and the gate dielectric layer 104.

The gate dielectric layer 104 is provided in both the first region 101 and second region 102. The gate dielectric layer 104 comprises a high-k (i.e. k>3.9) dielectric material. In particular embodiments the gate dielectric layer 104 is a Hf-containing dielectric layer such as for example $HfO_x$, HfSiON, HfON, HfZrO, HfAlO, HfLaO, . . . . The gate dielectric layer 104 may be formed by thermal oxidation, atomic layer deposition (ALD), chemical vapour deposition (CVD), physical vapour deposition (PVD), or any other suitable method known to a person skilled in the art.

The gate dielectric capping layer 105 is formed in contact with the gate dielectric layer 104. The gate dielectric capping layer 105 may be located on top of the gate dielectric layer 104. Alternatively the gate dielectric capping layer 105 may be located underneath the gate dielectric layer 104. The gate dielectric capping layer 105 may be provided using conventional process steps and equipment, as well known for a person skilled in the art, such as for example depositing a gate dielectric capping layer on the substrate in both the first 101 and the second 102 region.

The gate dielectric capping layer 105 comprises a dielectric material which is selected to ultimately tune the first effective work function of a first gate stack (still to be formed at this level in the process) in the first region. Further on in the integration scheme also a first metal gate electrode layer material is selected to further tune the first effective work function of the first gate stack. For example, the gate dielectric capping layer 105 may comprise $Dy_xO_y$.

In one embodiment, the gate dielectric capping layer 105 comprises an aluminum-based material, such as Al, $Al_xO_y$ (N). $Al_xO_y$(N) is know to be a dielectric with more electronegative atoms than the gate dielectric layer 104 such that the built-in dipole field in the dielectric (e.g. a HfSiON—AlO stack) may adapt the threshold voltage of the PMOS device independently of the work function of the metal gate electrode (e.g. TiN). The aluminium-based capping layer 105, e.g. AlO layer, will thus determine the effective work function, which is suitable for a PMOS transistor.

The gate dielectric capping layer 105 may have an equivalent oxide thickness (EOT) in the range of about 0.1 nm to 2 nm, more particularly in the range of about 0.1 nm to 1 nm and even in the range of about 0.1 nm to 0.5 nm. This corresponds to a physical thickness of the gate dielectric capping layer 105 in the range of about 0.2-2 nm.

The gate dielectric stack 107 has a physical thickness which may be in the range of 0.5 nm to 4 nm, leading to an EOT (equivalent oxide thickness) which may be below 2 nm.

After providing the gate dielectric stack 107 a thermal treatment 300 of the gate dielectric stack 107 is performed (FIG. 3). This thermal treatment comprises an annealing process, also known as post-deposition anneal (PDA). The PDA is performed after the formation of the gate dielectric capping layer 105 and before the formation of the first metal gate electrode. The annealing process may comprise a rapid thermal anneal (RTA), a spike anneal, a laser anneal or any other annealing process known to a person skilled in the art.

In embodiments of the present invention, the thermal treatment process may be performed in a low oxygen ambient such as $N_2$ or Ar at a temperature in the range between about 800 degrees Celsius and 1300 degrees Celsius during about 0.1 second up to 30 seconds. In particular embodiments, the thermal treatment process is performed at 1000 degrees Celsius during 1 second up to 30 seconds.

By performing the thermal treatment (PDA), intermixing occurs of the gate dielectric layer 104 and the gate dielectric capping layer 105. In particular embodiments, diffusion occurs from the gate dielectric capping layer 105 into the gate dielectric layer 104 (FIG. 4). In alternative embodiments, diffusion may occur from the gate dielectric layer 104 into the gate dielectric capping layer 105. The intermixing of the gate dielectric layer and the gate dielectric capping layer occurs so as to create a modified gate dielectric stack 107*bis*, the modified gate dielectric stack 107*bis* comprising the intermixed dielectric layer 108 (resulting from an intermixing of at least the gate dielectric layer 104 and the gate dielectric capping layer 105) defining an effective work function suitable for the first region. In the embodiment illustrated in FIG. 5, the modified gate dielectric stack 107*bis* comprises, besides the intermixed dielectric layer 108, also the interfacial dielectric layer 106. Optionally, in other embodiments, also the interfacial dielectric layer 106 may be intermixed with the gate dielectric layer and the gate dielectric capping layer (not shown) due to the thermal treatment 300.

It is an aspect of the present invention that the PDA thermal treatment 300 is performed after the deposition of the gate dielectric capping layer 105 but before the deposition of the first metal gate electrode 109.

In alternative embodiments, the gate dielectric stack 107 may be patterned first, before applying a thermal treatment, e.g. using conventional patterning techniques (lithography and etching) known to a person skilled in the art, such that the gate dielectric stack 107 is only present in the first region 101 after patterning. Thereafter a thermal treatment may be performed. The thermal treatment may thus be performed before or after patterning the gate dielectric stack. However the thermal treatment is performed before providing the first metal gate electrode layer 109.

The thermal treatment may be performed for tuning the effective work function of the PMOS transistor.

After the thermal treatment a first metal gate electrode layer 109 is provided overlying (on and in contact with) the modified gate dielectric stack 107*bis* (FIG. 5).

The first metal gate electrode layer 109 is formed having a first (as-deposited) work function. The first metal gate electrode layer 109 comprises a metal comprising material to form a metal gate. With metal comprising material is understood metals, metal alloys, metal silicides, conductive metal nitrides, conductive metal oxides, . . . . Depending on the metal in the metal comprising material, the work function of the first metal gate electrode layer 109 may be similar to the work function of a conventional p-type doped semiconductor or to the work function of a conventional n-type doped semiconductor. For example nickel (Ni), ruthenium oxide (RuO), and molybdenum nitride (MoN) have a work function similar to a p-type doped semiconductor material. For example ruthenium (Ru), zirconium (Zr), niobium (Nb), tantalum (Ta), titanium silicide ($TiSi_2$) have a work function similar to a n-type doped semiconductor material. For example TiN has a midgap work function i.e. in between the work function for n-type doped and p-type doped semiconductor material (for TiN on $SiO_2$, .about.4.65 eV-4.8 eV).

In particular embodiments a first metal gate electrode layer 109 is formed having a first (as-deposited) work function WF which is suitable for forming a PMOS gate electrode (i.e. PMOS transistor) in the first region 101, but which is not suitable for forming a NMOS gate electrode (i.e. NMOS transistor) in the second region 102.

The modified gate dielectric stack 107*bis* located under the first metal gate electrode layer 109 will induce a first work function shift of the as-deposited work function of the first metal gate electrode material 109. The metal gate electrode layer 109 together with the modified gate dielectric stack 107*bis* determines the effective work function of the first transistor (i.e. PMOS transistor) in the first region 101 (i.e. PMOS region).

The first metal gate electrode layer 109 has a thickness in the range of about 0.5 nm to 100 nm, for example in the range of 5 nm to 10 nm and may be applied by any suitable process; for example it may be deposited using a deposition technique such as for example ALD, CVD, or PVD.

Figure 6:
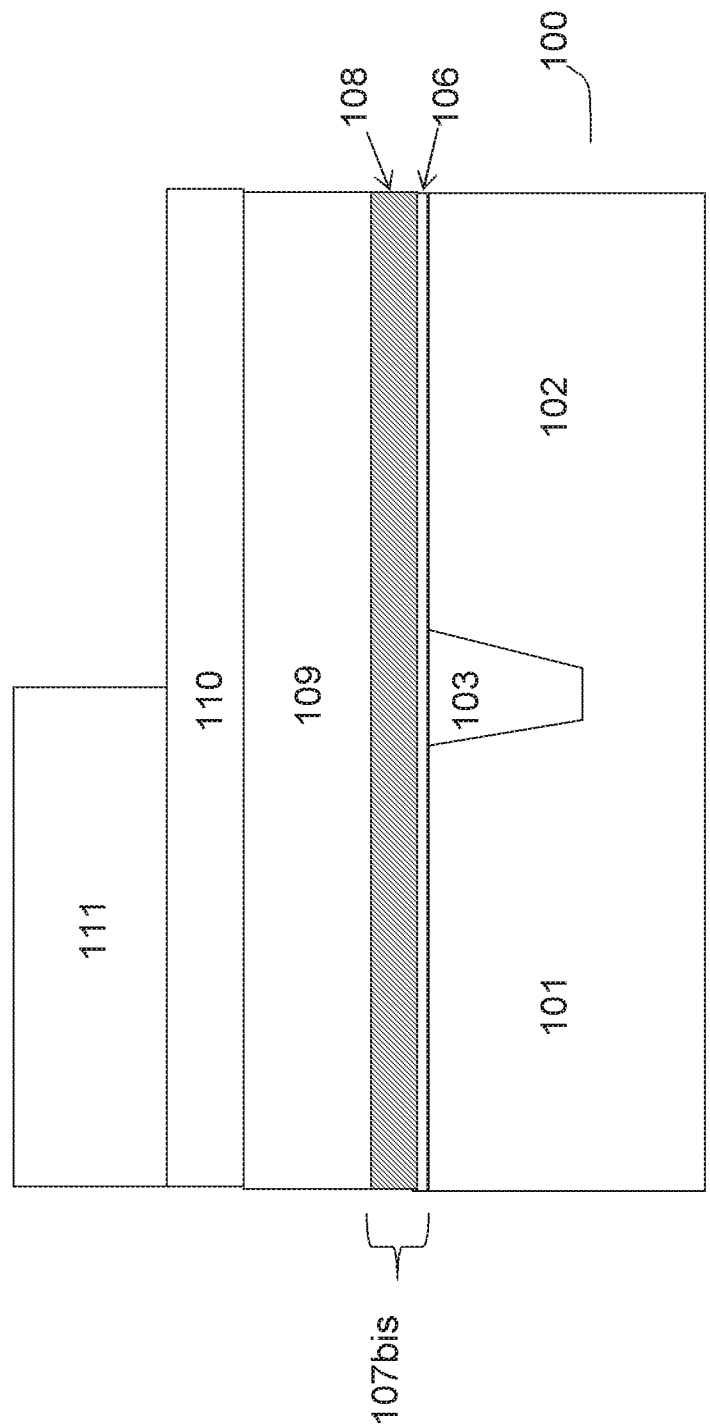
Figure 7:
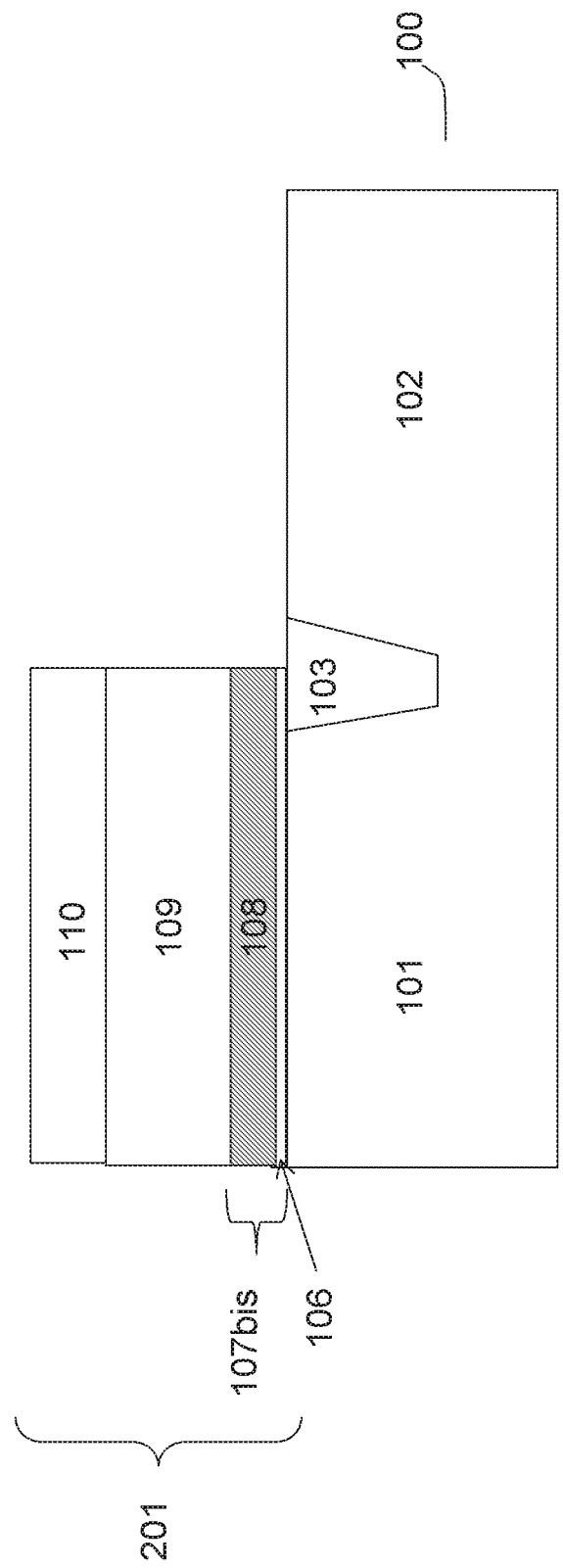

In a following process the stack of layers 107*bis*, 109 still available on both the first 101 and second 102 region is patterned using conventional techniques (lithography, etching) to form a first gate stack 201 in the first region 101 (FIGS. 6, 7). The first gate stack 201 comprises the first metal gate electrode layer 109 on and in contact with the modified gate dielectric stack 107*bis*.

The patterning process may comprise first providing an etch stop layer 110, for example a Si-containing layer, on top of the first metal gate electrode layer 109. Such Si-containing layer 110 may comprise for example poly-Si. The etch stop layer 110 may have a thickness in the range of 5 nanometers to 30 nanometers. After providing the etch stop layer 110 a photoresist layer 111 may be provided and patterned using known techniques (lithography, etching). The patterned photoresist layer 111 serves as a mask for patterning (etching) the underlying layers (i.e. the modified gate dielectric stack 107*bis*, the first metal gate electrode layer 109 and the etch stop layer 110.

After the different process steps for patterning the first gate stack 201, and as such also defining the first transistor, the modified gate dielectric stack 107*bis*, the first metal gate electrode layer 109 and the etch stop layer 110 are only present in the first region 101. They may define the gate stack for the PMOS transistor.

After providing the first gate stack 201 a second gate stack 202 is formed in the second region 102. For the formation of the second gate stack one may use different integration techniques known to a person skilled in the art.

Figure 8:
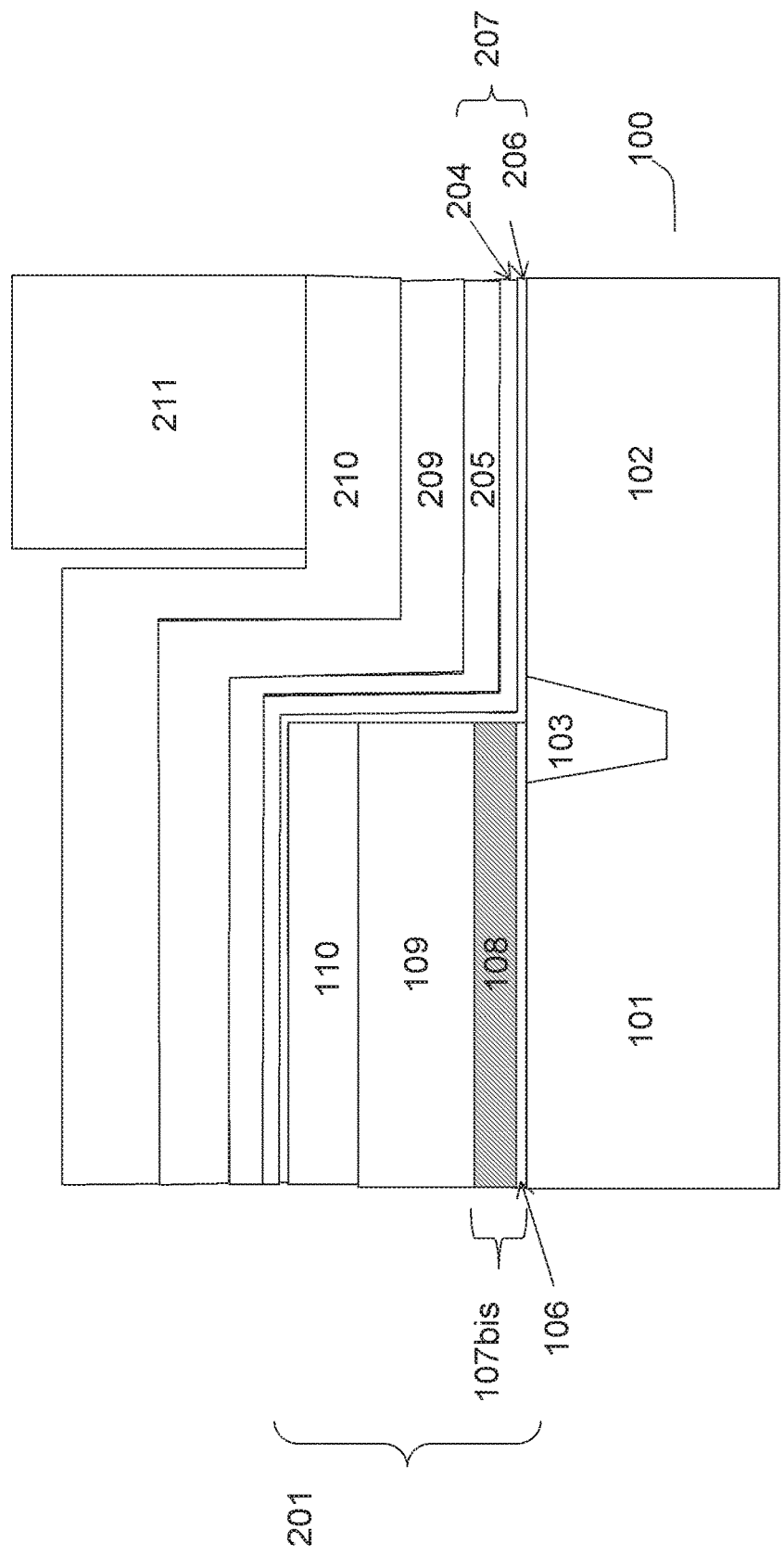

As shown in FIG. 8 different layers may be formed in the first region and the second region. In the first region 101 these layers are overlying the first gate stack 201, whereas in the second region 102 these layers are overlying the substrate 100. Similar to the formation of the first gate stack an (optional) second interfacial layer 206, a second gate dielectric layer 204, a second gate dielectric capping layer 205, a second metal gate electrode layer 209 and a second etch stop layer 210, e.g. a Si-containing layer, may be formed.

The second gate dielectric capping layer 205 is formed in contact with the second gate dielectric layer 204. Optionally also an interfacial dielectric layer 206 (e.g. $SiO_2$) is provided between the substrate 100 and the stack comprising the second gate dielectric layer 204 and the second gate dielectric capping layer 205.

The second gate dielectric layer 204 comprises a high-k (i.e. k>3.9) dielectric material. In particular embodiments, the second gate dielectric layer 204 is a Hf-containing dielectric layer such as for example $HfO_x$, HfSiON, HfON, HfZrO, HfAlO, HfLaO, . . . . The second gate dielectric layer 204 may be formed by thermal oxidation, atomic layer deposition (ALD) or chemical vapour deposition (CVD) or physical vapour deposition (PVD), or any other suitable method known to a person skilled in the art.

The second gate dielectric capping layer 205 is formed in contact with the second gate dielectric layer 204. The second gate dielectric capping layer 205 may be located on top of the second gate dielectric layer 204. Alternatively the second gate dielectric capping layer 205 may be located underneath the second gate dielectric layer 204. The second gate dielectric capping layer 205 may be provided using conventional process steps and equipment, as well known for a person skilled in the art.

The second gate dielectric capping layer 205 comprises a dielectric material which is selected to tune the second effective work function of the second gate stack in the second region. Further on in the integration scheme also the second metal gate electrode layer material is selected to further tune the second effective work function of the second gate stack.

In one embodiment, the second gate dielectric capping layer 205 comprises a lanthanide-based dielectric. In particular embodiments, the second gate dielectric capping layer 205 may be selected from the group consisting of DyO, LaO, GdO, ErO, MgO, SrO, SrTiO and mixtures thereof.

For example $La_xO_y(N)$ is know to be a dielectric with more electropositive atoms than the gate dielectric layer 204 such that the built-in dipole field in the dielectric (e.g. HfSiON—LaO stack) may adapt the threshold voltage of the NMOS device independently of the work function of the metal gate electrode (e.g. TiN). The LaO layer will thus determine the effective work function, which is suitable for a NMOS transistor.

In particular embodiments, the second gate dielectric capping layer 205 may have an equivalent oxide thickness (EOT) in the range of about 0.1 nm to 2 nm, for example in the range of about 0.1 nm to 1 nm, such as in the range of about 0.2 nm to 0.5 nm. This corresponds to a physical thickness of the second gate dielectric capping layer 205 in the range of about 0.2-2 nm.

The second metal gate electrode layer 209 is formed having a second (as-deposited) work function. The second metal gate electrode layer 209 comprises a metal comprising material to form a metal gate. With metal comprising material is understood metals, metal alloys, metal silicides, conductive metal nitrides, conductive metal oxides, . . . . Depending on the metal, the work function of the second metal gate electrode layer 209 may be similar to the work function of a conventional n-type doped semiconductor or to the work function of a conventional p-type doped semiconductor. For example nickel (Ni), ruthenium oxide (RuO), and molybdenum nitride (MoN) have a work function similar to a p-type doped semiconductor material. For example ruthenium (Ru), zirconium (Zr), niobium (Nb), tantalum (Ta), titanium silicide ($TiSi_2$) have a work function similar to a n-type doped semiconductor material. For example TiN has a midgap work function i.e. in between the work function for n-type doped and p-type doped semiconductor material (for TiN on $SiO_2$, .about.4.65 eV-4.8 eV).

In particular embodiments of the present invention a second metal gate electrode layer 209 is formed having a second (as-deposited) work function WF which is suitable for forming a NMOS gate electrode (i.e. NMOS transistor) in the second region 102, but which is not suitable for forming a PMOS gate electrode (i.e. PMOS transistor) in the first region 101.

The second gate dielectric stack 207 located under the second metal gate electrode layer 209 will induce a second work function shift of the as-deposited work function WF of the second metal gate electrode material 209. The second metal gate electrode layer 209 together with the second gate dielectric stack 207 determines the effective work function of the second transistor (i.e. NMOS transistor) in the second region 102 (i.e. NMOS region).

The second metal gate electrode layer 209 has a thickness in the range of about 0.1 nm to 100 nm, for example in the range of 5 nm to 10 nm, and is deposited using a deposition technique such as for example ALD, CVD, or PVD.

A second etch stop layer 210, for example a Si-containing layer, may be provided on top of the second metal gate electrode layer 209. This second etch stop layer 210 may comprise for example poly-Si. The second etch stop layer 210 serves as a barrier layer for a photo resist layer 211 to be applied. The second etch stop layer 210 may have a thickness in the range 5 nanometers to 30 nanometers.

After providing the second etch stop layer 210 a photoresist layer 211 may be provided and patterned using known techniques (lithography, etching) (FIG. 8). The patterned photoresist layer 211 serves as a mask for patterning (etching) the redundant layers in the first region (i.e. the second gate dielectric stack 207, the second metal gate electrode layer 209 and the second etch stop layer 210 present in the first region 101 on top of the first gate stack 201.

Figure 9:
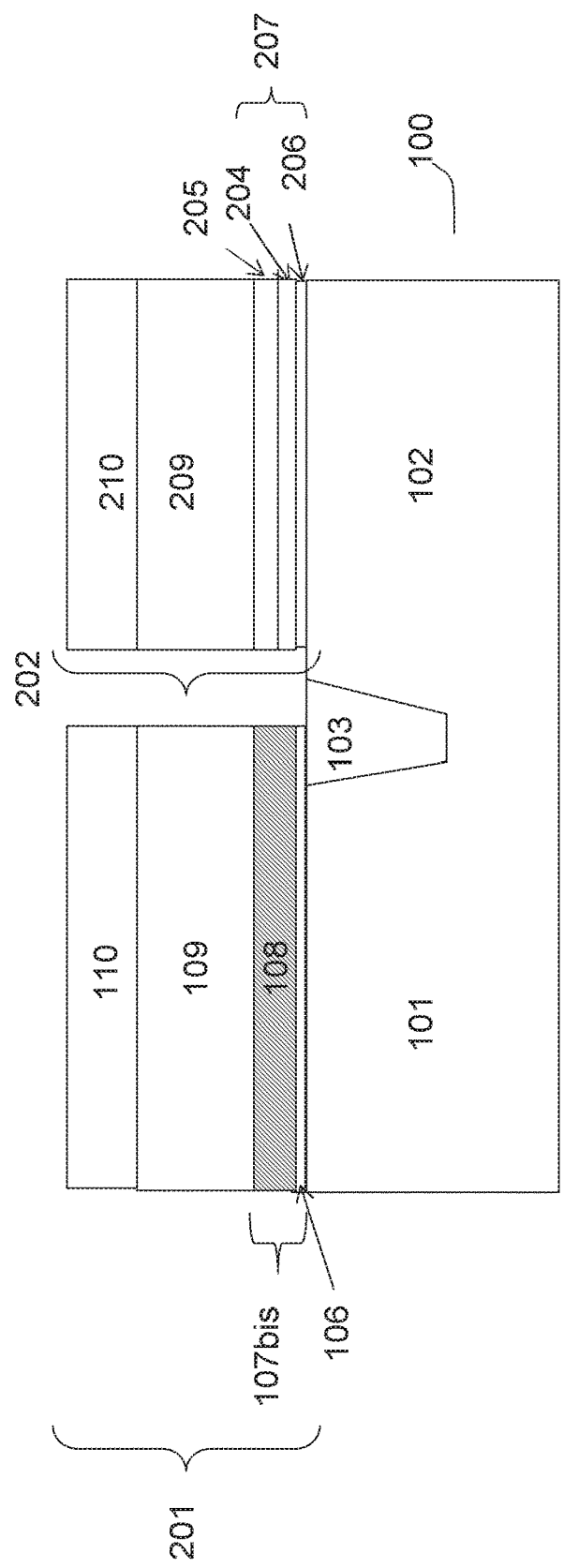

After the different process steps for patterning the second gate stack 202 (FIG. 9), and as such also defining the second transistor, the second gate dielectric stack 207, the second metal gate electrode layer 209 and the etch stop layer 210 are only present in the second region 102. They may define the gate stack for the NMOS transistor.

If necessary a final patterning process may be performed to further pattern the first and second gate stack to desired dimensions.

The first effective work function of the first gate stack 201 in the first region 101 may for example be in the range of 4.7 eV to 5.2 eV. This is thus an effective work function suitable for a PMOS transistor.

The second effective work function of the second gate stack 202 in the second region 102 may for example be in the range of 4.0 eV to 4.5 eV. This is thus an effective work function suitable for a NMOS transistor.

One embodiment of the present invention relates to a semiconductor device, more particularly a dual work function semiconductor device obtainable by a method disclosed herein.

In particular, one embodiment of a dual work function CMOS device comprises:

a semiconductor substrate at least a PMOS transistor, the PMOS transistor comprising an intermixed gate dielectric layer, for example a Hf-containing layer, and gate dielectric capping layer, for example an Al-containing layer, and a metal gate electrode layer thereon;

at least an NMOS transistor, the NMOS transistor comprising a gate dielectric layer, for example a Hf-containing layer, and a gate dielectric capping layer, for example a La-containing layer, and another metal gate electrode layer.

The method for manufacturing a dual work function device and the device obtained thereof may be applied for a planar semiconductor device (as also shown in the accompanied figures), but also other configurations such as a non-planar or finfet semiconductor device are possible.

Figure 10:
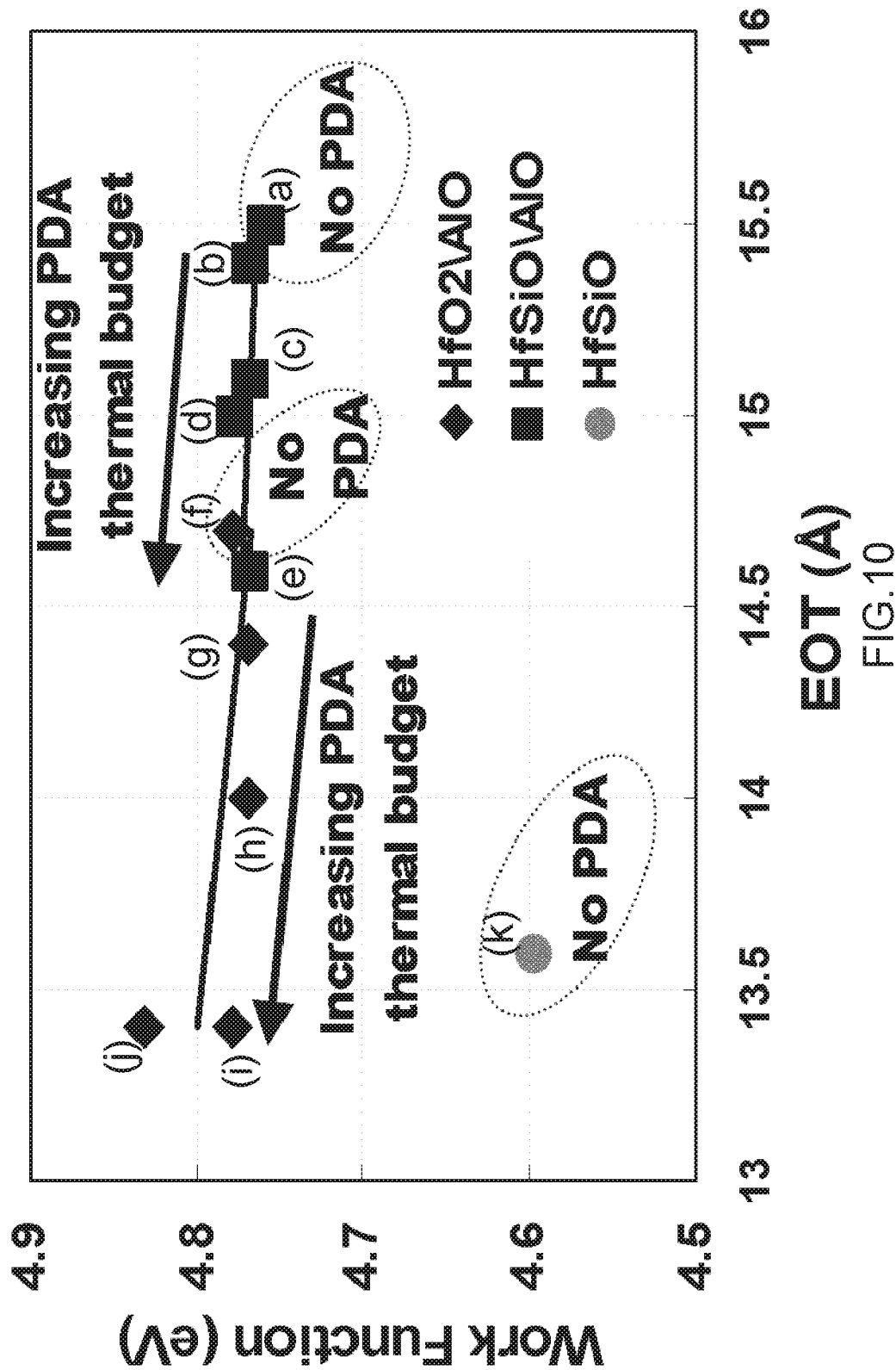
FIG. 10 shows experimental results for the effective work function (EWF) in function of the effective oxide thickness (EOT) for a modified gate dielectric stack manufactured according to embodiments of certain inventive aspects. The illustration is for a gate dielectric stack comprising a Hf-containing dielectric layer, such as $HfO_2$ or HfSiO, and an Al-containing gate dielectric capping layer, such as AlO. After the formation of the Al-containing gate dielectric capping layer a post dielectric annealing (PDA) is performed at different process conditions, as illustrated in the drawing, at temperatures ranging between 900 degrees Celsius and 1000 degrees Celsius in $N_2$. EOT is reduced with the increase of PDA, substantially without EWF penalty. All wafers are followed by a 1035 degrees Celsius spike annealing. PDA enhances dielectric densification and inter-mixing with lower EOT.

FIG. 10 shows experimental data of the effective work function (eV) in function of the equivalent oxide thickness (EOT, in .ANG.) for different gate dielectric stacks ($HfO_2$/AlO, HfSiO/AlO, HfSiO) and different process parameters for the thermal treatment performed (PDA at 900° C. during 30 s, at 950° C. during 30 s, at 1000° C. during 10 s and at 1000° C. during 30 s). All thermal treatments are followed by a 1035° C. junction annealing. This low thermal budget activation annealing process is not influencing the effective work function of the semiconductor device.

It is an advantage of embodiments of the present invention that a dual work function semiconductor device may be manufactured wherein the thermal treatment for tuning the work function of the semiconductor device is easily combinable with other activation annealing process in the process flow, such as for example junction activation by laser annealing or other low thermal budget activation annealing.

For a gate dielectric stack with a gate dielectric layer of HfSiO and without a gate dielectric capping layer (dot) the effective work function is about 4.6 eV and an EOT of about 1.35 nm (k). This dielectric gate stack did not have a PDA treatment.

For a gate dielectric stack with a HfSiO gate dielectric layer and a AlO gate dielectric capping layer (squares) the effective work function is about 4.75 eV and an EOT of about 1.55 nm without a PDA treatment (a). By applying a PDA treatment of 1000 degrees Celsius during 30 seconds (e) it is observed that the effective work function is increasing up to 4.78 eV and the EOT is decreasing to about 1.45 nm compared to the experimental data without PDA treatment. Four different process conditions are applied for the PDA treatment: (a) No PDA, (b) PDA at 900 degrees Celsius during 30 seconds, (c) PDA at 950 degrees Celsius during 30 seconds, (d) PDA at 1000 degrees Celsius during 10 seconds, (e) PDA at 1000 degrees Celsius during 30 seconds. With increasing PDA thermal budget, the effective work function is slightly increasing and the EOT is decreasing.

For a gate dielectric stack with a $HfO_2$ gate dielectric layer and a AlO gate dielectric capping layer (diamonds) the WF is about 4.78 eV and an EOT of about 1.48 nm without a PDA treatment (f). By applying a PDA treatment of 1000 degrees Celsius during 30 seconds (j) it is observed that the effective work function is increasing up to 4.83 eV and the EOT is decreasing to about 1.34 nm compared to the experimental data without PDA treatment. Four different process conditions are applied for the PDA treatment: (f) No PDA, (g) PDA at 900 degrees Celsius during 30 seconds, (h) PDA at 950 degrees Celsius during 30 seconds, (i) PDA at 1000 degrees Celsius during 10 seconds, (j) PDA at 1000 degrees Celsius during 30 seconds. With increasing PDA thermal budget, the effective work function is increasing and the EOT is decreasing.

From these experimental results on different gate dielectric stacks with AlO gate dielectric capping layer it is shown that a thermal treatment (PDA) after the deposition of the AlO-capping layer (and before the deposition of the metal gate electrode layer) leads to a higher effective work function (suitable for a PMOS transistor) and lower EOT. This is due to the intermixing and densification without any effective work function penalty.

In another experiment (FIG. 11) the same thermal treatment conditions are applied, however the PDA is performed after the metal gate deposition, e.g. after a 5 nm TaN layer is deposited by PVD. This process is also known as PMA.

For a gate stack with a gate dielectric layer of HfSiO, without a gate dielectric capping layer (dot) and with a TaN metal gate electrode layer on top of the gate dielectric layer the effective work function is about 4.6 eV and an EOT of about 1.35 nm (k). This dielectric gate stack did not have a PMA treatment. When applying a PMA treatment for the same gate stack (l) of 1000 degrees Celsius during 30 seconds an increase of the effective work function up to 4.7 eV and an increase of the EOT up to 1.85 nm is observed.

For a gate stack with a HfSiO gate dielectric layer, a AlO gate dielectric capping layer and a TaN metal gate electrode layer on top of the AlO capping layer (squares) the effective work function is about 4.75 eV and an EOT of about 1.55 nm without a PDA treatment (a). By applying a PDA treatment of 1000 degrees Celsius during 30 seconds (e) it is observed that the effective work function is increasing up to 4.95 eV and the EOT is increasing to about 2.2 nm compared to the experimental data without PDA treatment. The increase of the EOT is however not desired. Four different process conditions are applied for the PDA treatment: (a) No PDA, (b) PDA at 900 degrees Celsius during 30 seconds, (c) PDA at 950 degrees Celsius during 30 seconds, (d) PDA at 1000 degrees Celsius during 10 seconds, (e) PDA at 1000 degrees Celsius during 30 seconds. All thermal treatments were followed by a 1035.degree. C. junction annealing. With increasing PDA thermal budget, the effective work function is increasing and the EOT is also increasing.

For a gate stack with a $HfO_2$ gate dielectric layer, a AlO gate dielectric capping layer and a TaN metal gate electrode layer on top of the AlO capping layer (diamonds) the effective work function is about 4.78 eV and an EOT of about 1.48 nm without a PDA treatment (f). By applying a PDA treatment of 1000 degrees Celsius during 30 seconds (j) it is observed that the effective work function is increasing up to 4.91 eV and the EOT is also increasing to about 2.05 nm compared to the experimental data without PDA treatment. Four different process conditions are applied for the PDA treatment: (f) No PDA, (g) PDA at 900 degrees Celsius during 30 seconds, (h) PDA at 950 degrees Celsius during 30 seconds, (i) PDA at 1000 degrees Celsius during 10 seconds, (j) PDA at 1000 degrees Celsius during 30 seconds. All thermal treatments were followed by a 1035.degree. C. junction annealing With increasing PDA thermal budget, the effective work function is increasing and the EOT is also increasing.

From these experimental results on different gate dielectric stacks with AlO gate dielectric capping layer and TaN metal gate electrode it is shown that a thermal treatment (PMA) after the deposition of the TaN metal gate electrode layer leads to a higher effective work function (suitable for a PMOS transistor), but, however, also a higher EOT. The higher EOT is not desirable.

Figure 12:
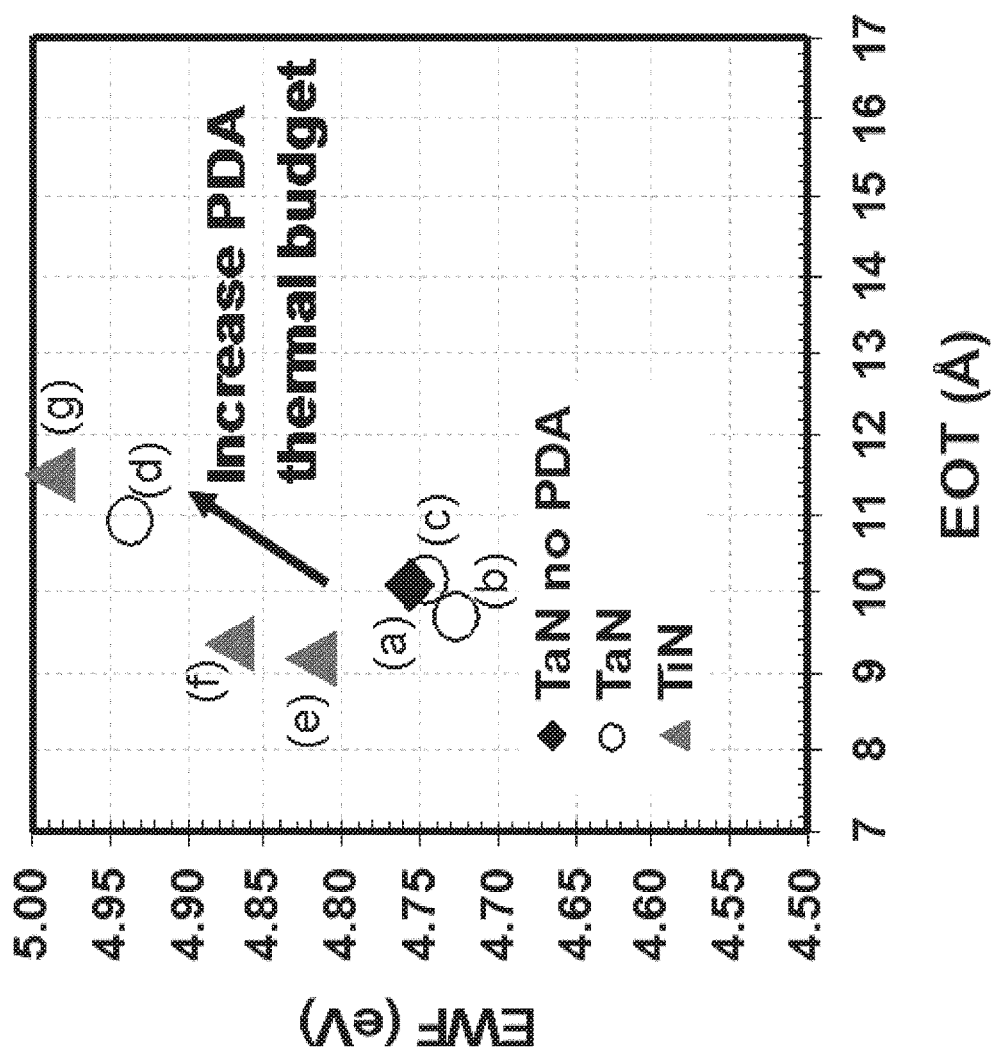
FIG. 12 shows experimental results for the effective work function in function of the effective oxide thickness (EOT) for a metal gate stack manufactured according to embodiments certain inventive aspects. The gate stack comprises a Hf-containing dielectric layer, an Al-containing gate dielectric capping layer and a TaN or a TiN metal gate electrode layer. After the formation of the Al-containing gate dielectric capping layer (and before the formation of the metal gate electrode layer) a PDA is performed at different process conditions, as illustrated in the drawing.

FIG. 12 shows experimental data of the effective work function in function of equivalent oxide thickness (EOT) for different PDA annealing conditions with different gate stacks comprising a AlO gate dielectric capping layer, i.e. for PMOS transistor. The gate stack comprises a 1.2 nm $HfO_2$ gate dielectric layer, thereon a 0.9 nm AlO gate dielectric capping layer and thereon a metal gate electrode comprising a 7 nm layer of TaN and a 3 nm layer of TiN in one experiment, or a metal gate electrode comprising a 7 nm layer of TaN and a 10 nm layer of TiN in another experiment. After deposition of the AlO gate dielectric capping layer and before the deposition of the metal gate electrode layer(s) a PDA treatment is performed at different process conditions (a) no PDA, (b) and (e) PDA at 950 degrees Celsius during 30 seconds, (c) and (f) PDA at 1000 degrees Celsius during 10 seconds, (d) and (g) PDA at 1000 degrees Celsius during 30 seconds.

With increasing PDA thermal budget an increase in effective work function is observed from about 4.7 eV up to 4.95 eV as well as a slight increase of the EOT is observed from about 0.9 nm up to 1.15 nm.

Figure 13:
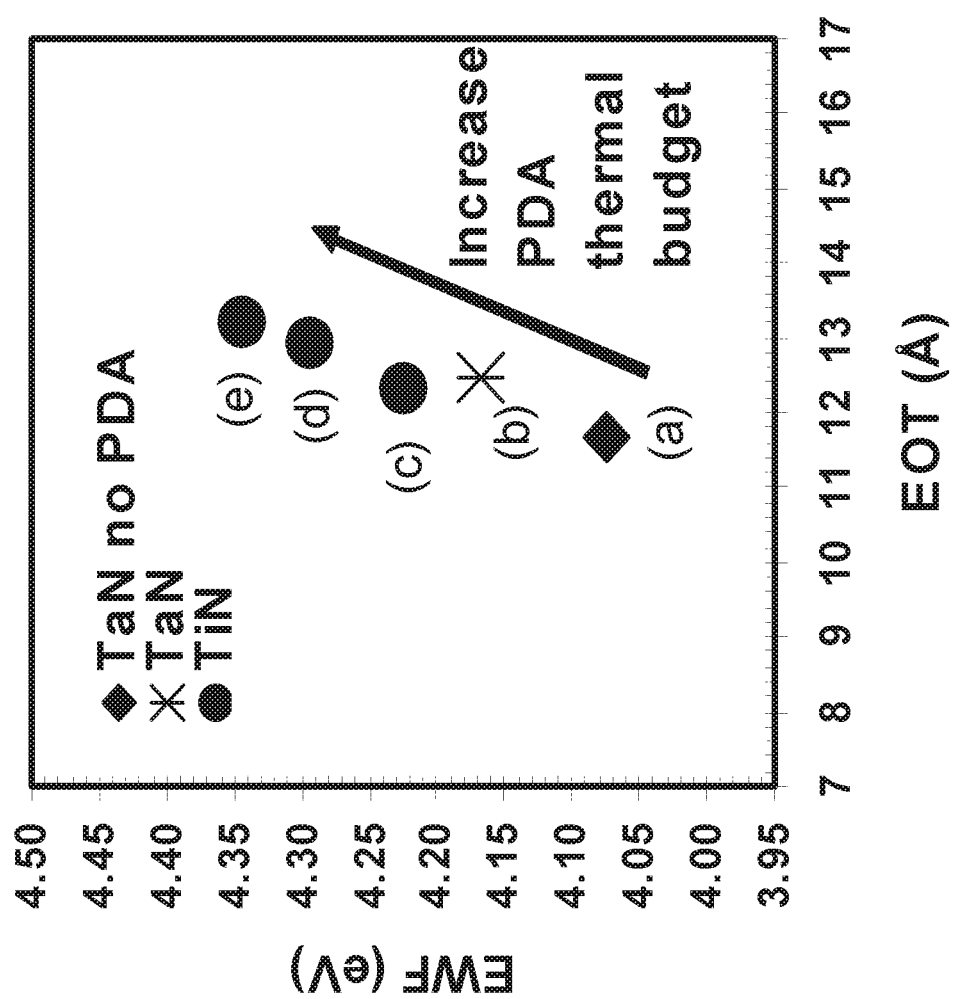
FIG. 13 shows experimental results for the effective work function in function of the effective oxide thickness (EOT) for a metal gate stack manufactured according to embodiments of certain inventive aspects. The gate stack comprises a Hf-containing dielectric layer, an La-containing gate dielectric capping layer and a TaN or a TiN metal gate electrode layer. After the formation of the La-containing gate dielectric capping layer (and before the formation of the metal gate electrode layer) a PDA is performed at different process conditions, as illustrated in the drawing.

FIG. 13 shows experimental data of the effective work function in function of equivalent oxide thickness (EOT) for different PDA annealing conditions with different gate stacks comprising a LaO gate dielectric capping layer, i.e. for NMOS transistor. The gate stack comprises a 1.2 nm $HfO_2$ gate dielectric layer, thereon a 0.7 nm LaO gate dielectric capping layer and thereon a metal gate electrode comprising a 7 nm layer of TaN and a 3 nm layer of TiN in one experiment, or a metal gate electrode comprising a 7 nm layer of TaN and a 10 nm layer of TiN. After deposition of the LaO gate dielectric capping layer and before the deposition of the metal gate electrode layer(s), a PDA treatment is performed at different process conditions (a) no PDA, (c) PDA at 950 degrees Celsius during 30 seconds, (b) and (d) PDA at 1000 degrees Celsius during 10 seconds, (e) PDA at 1000 degrees Celsius during 30 seconds.

With increasing PDA thermal budget an increase in effective work function is observed from about 4.0 eV up to 4.45 eV as well as an increase of the EOT from about 1 nm up to 1.4 nm. This is not desirable for a NMOS transistor (using LaO gate dielectric capping layer) as for NMOS transistor the effective work function should be lowered. Also an increase of EOT is not desirable for the proper working of the device.

MOSFETs were fabricated using a conventional gate-first process. A V-etch process was introduced to create a $SiO_2$ thickness profile. Different materials and processes were used to form the interfacial $SiO_2$ layer (IL: chemical oxide, RTO), high-k dielectric (ALD Hf(Zr)O, MOCVD HfSiO (N)), cap dielectric (ALD $Al_2O_3$) and metal gate (CVD/AVD TaCNO, AVD/PVD Ta(Al)N, ALD/PVD Ti(Al, Si)N, PVD W(O)). RTA, Laser-only and $O_2/N_2$ annealing conditions were evaluated for various gate-stacks.

Material and Thermal Effect—Observations and Model

Figure 11:
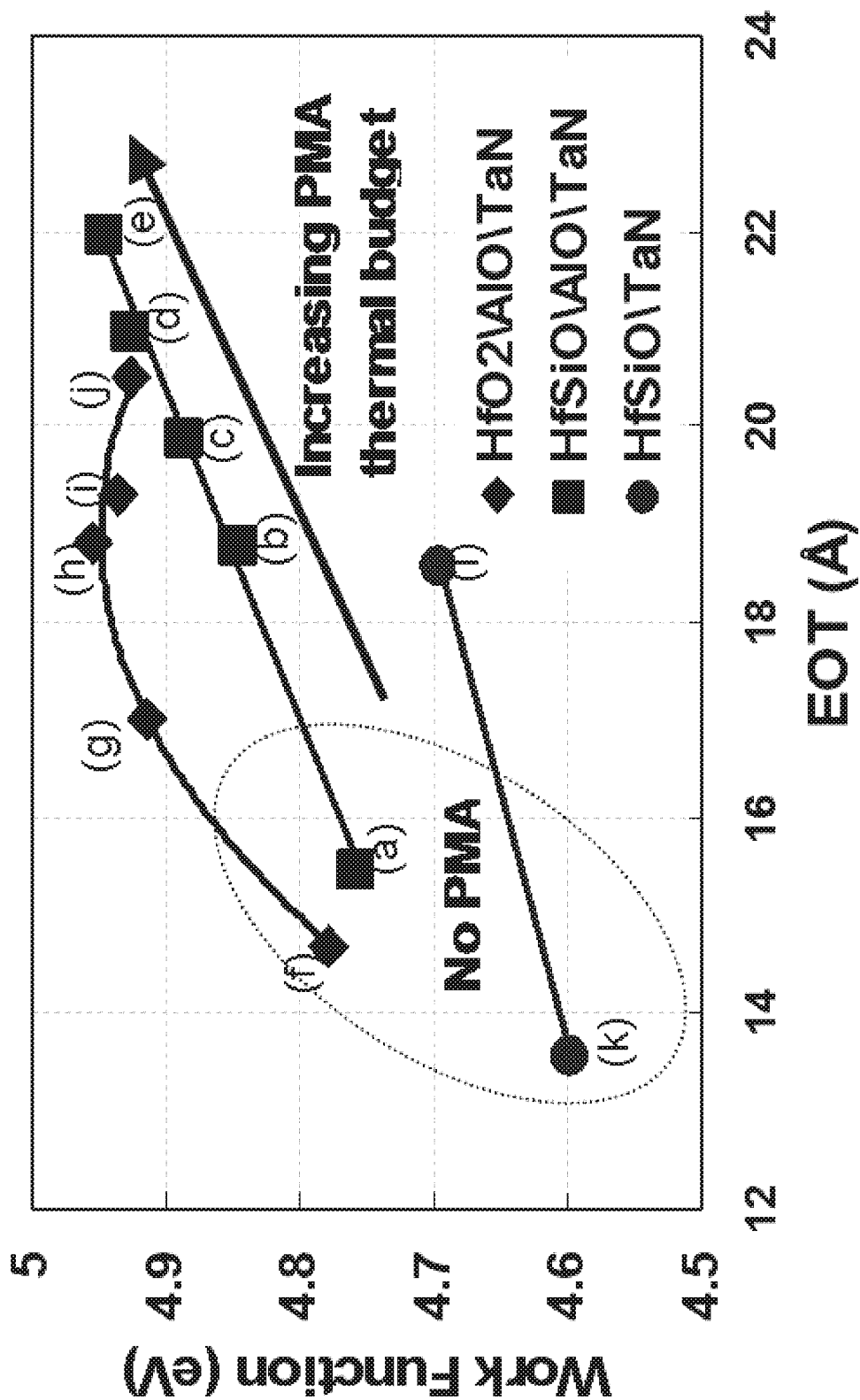
FIG. 11 shows experimental results for the effective work function (EWF) in function of the effective oxide thickness (EOT) for metal gate stacks with post metal gate annealing (PMA). The gate stack comprises a Hf-containing dielectric layer such as $HfO_2$ or HfSiO, optionally an Al-containing gate dielectric capping layer such al AlO, and a TaN metal gate electrode layer. After the formation of the TaN metal gate electrode layer a Post Metal Annealing (PMA) is performed at different process conditions, as illustrated in the drawing, at temperatures ranging from 900 degrees Celsius to 1000 degrees Celsius in $N_2$. Both EWF and EOT are increased with the increase of PMA. It is similar to the $V_{fb}$ roll-off trend illustrated later.
Figure 14:
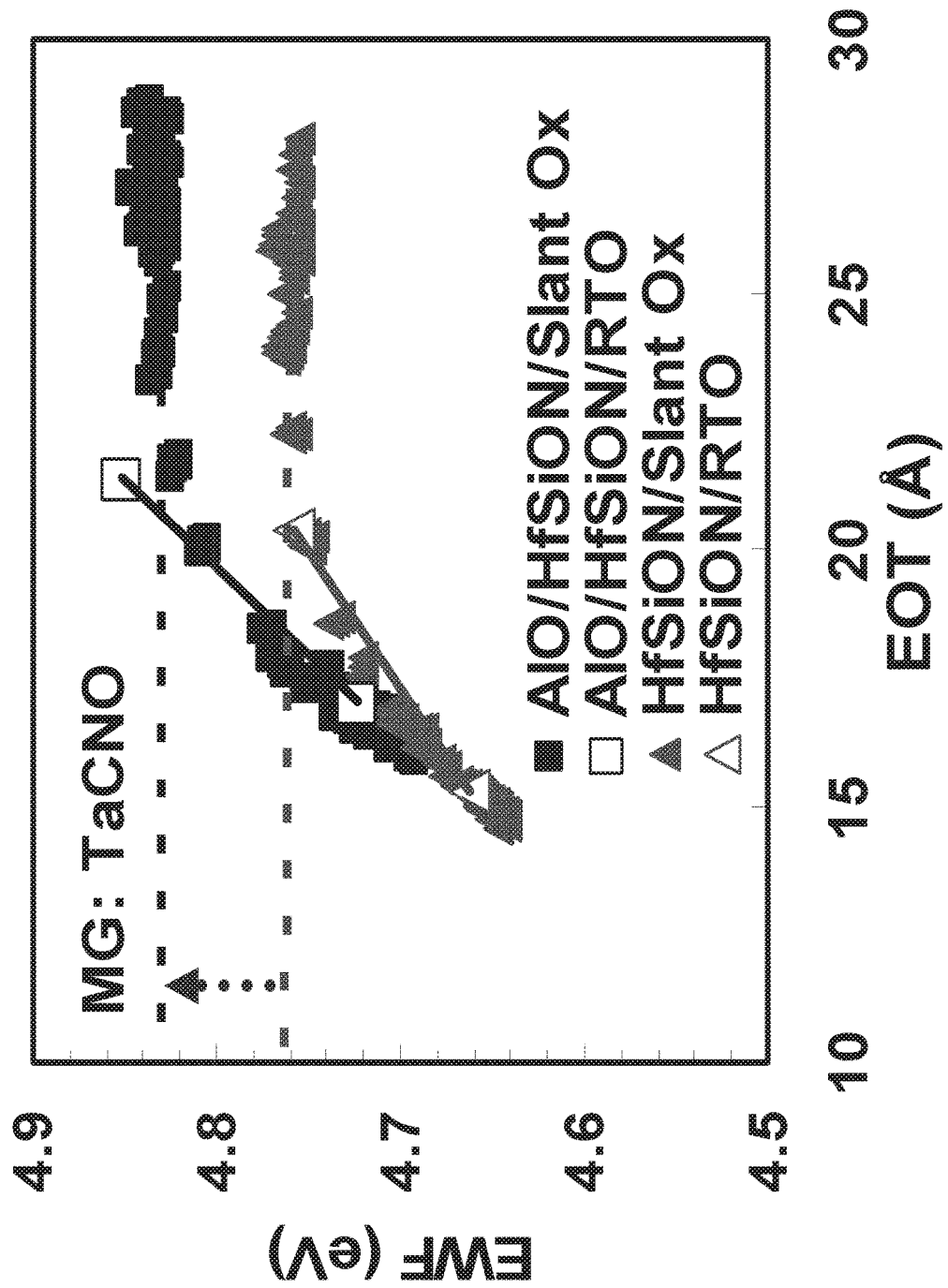
FIG. 14 shows experimental results for the effective work function (EWF) in function of the effective oxide thickness (EOT). $Al_2O_2$ capping layer on high-k dielectric layer (Hf-SiON) is used for increasing PMOS EWF. However such effect disappears due to more serious flatband voltage roll-off effect. Different interfacial layer oxides demonstrate the same behaviour.
Figure 15:
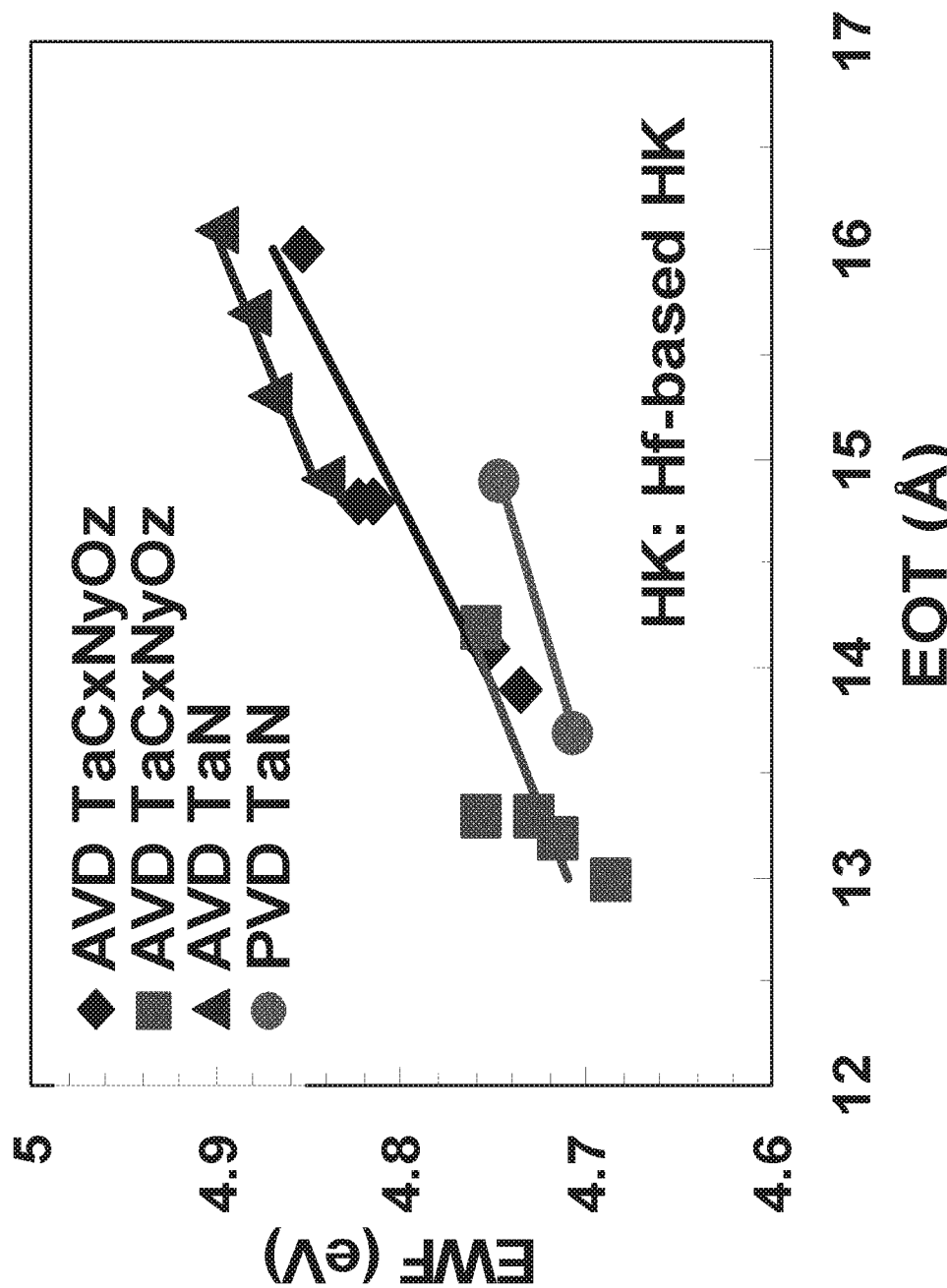
FIG. 15 shows experimental results for the effective work function (EWF) in function of the effective oxide thickness (EOT) for different metal precursors. By tuning different metal gate processes (physical vapour deposition (PVD) vs. atomic vapour deposition (AVD)) and metal gate precursors (C, N, O content in TaCxNyOz), EWF-EOT actually follows similar flat-band voltage ($V_{fb}$) roll-off trend.
Figure 16:
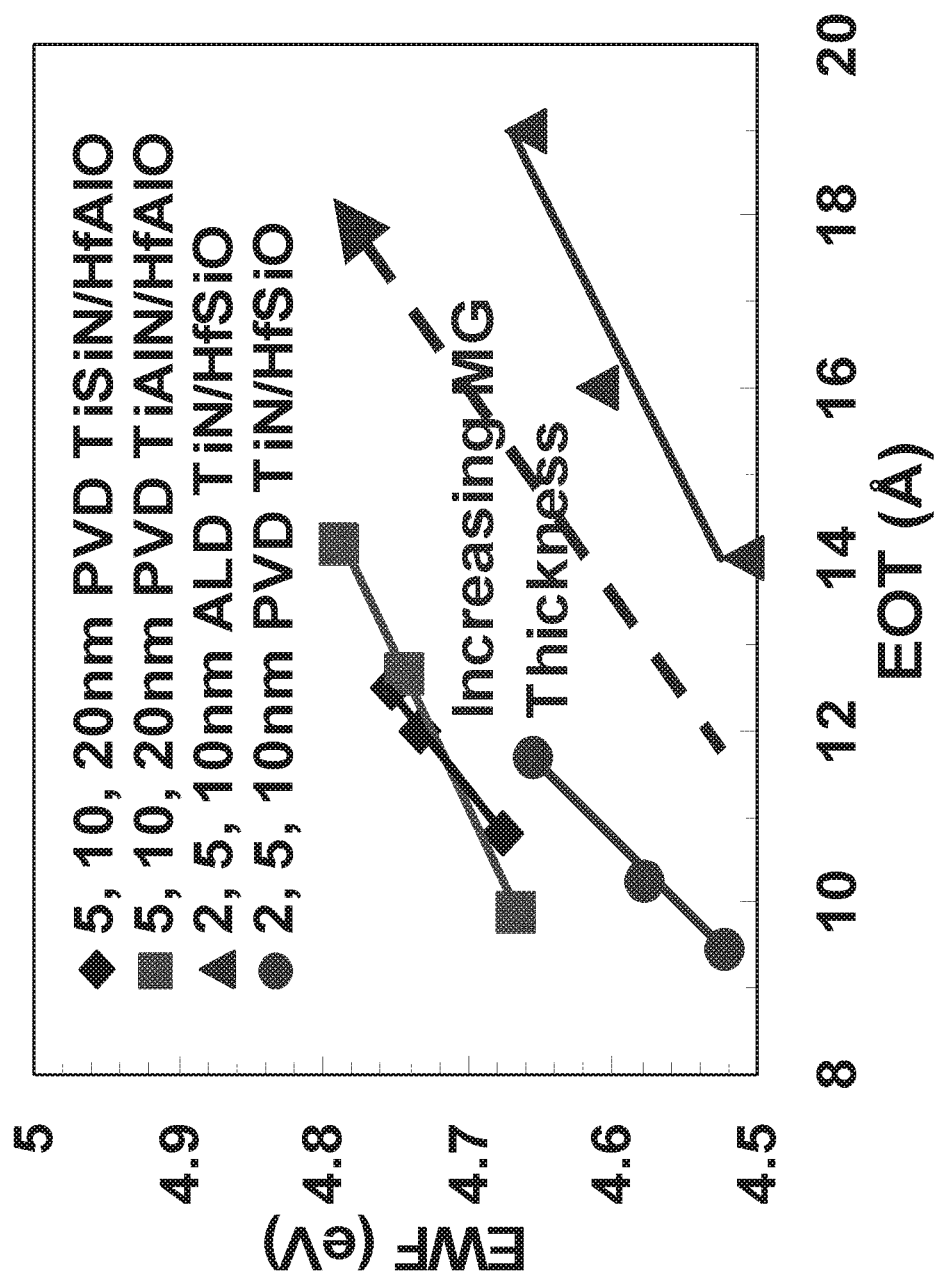
FIG. 16 shows experimental results for the effective work function (EWF) in function of the effective oxide thickness (EOT) for different metal gate thicknesses. Increasing metal gate thickness leads to higher EWF with higher EOT like $V_{fb}$ roll-off trend in different metal gate/high-k dielectric (MG/HK) stacks. MG thickness effect will be difficult to adopt for PMOS in lower EOT region.
Figure 19:
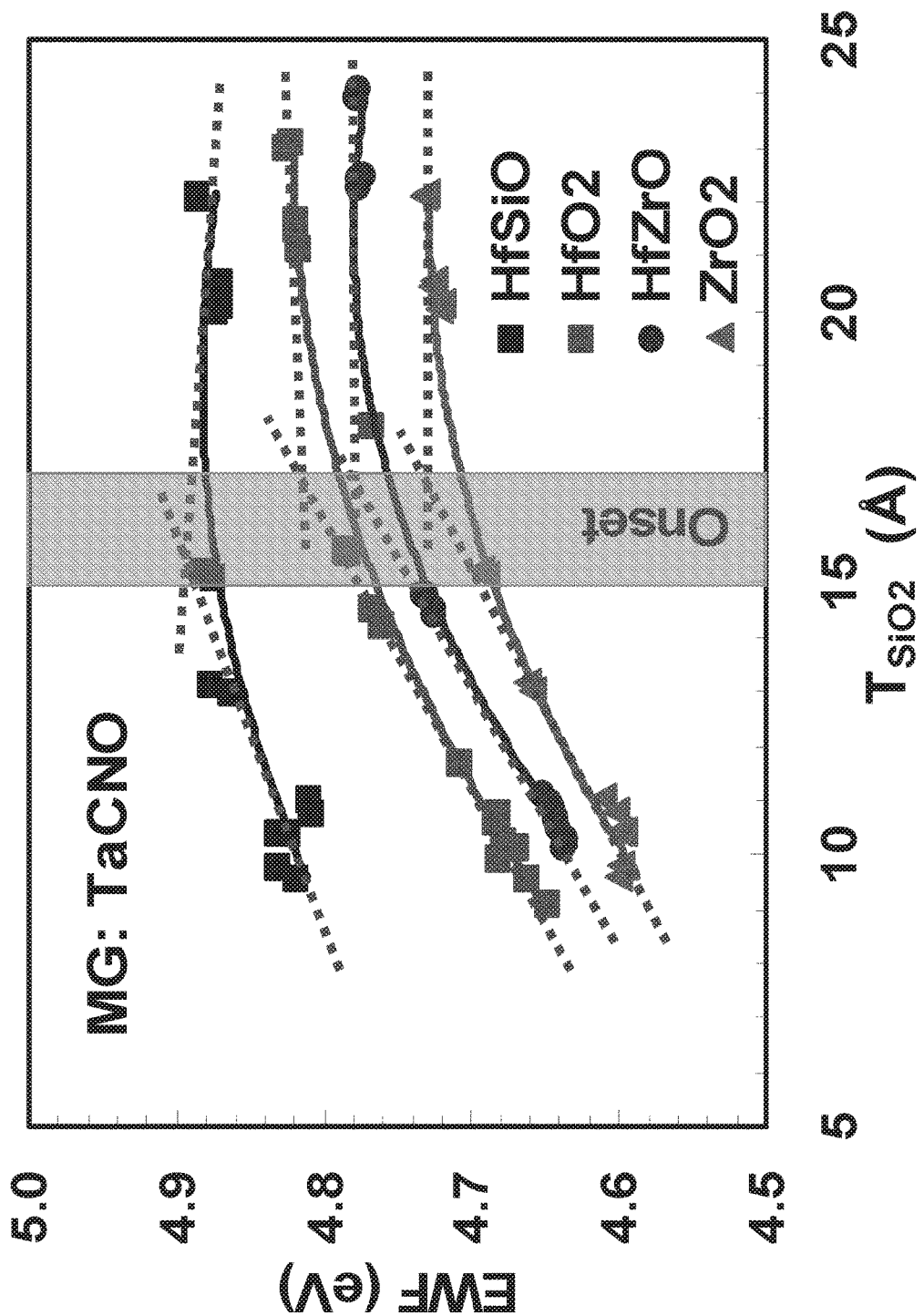
FIG. 19 shows experimental results for the effective work function (EWF) in function of the physical $SiO_2$ thickness ($TSiO_2$). The $TSiO_2$ (Physical IL thickness calculated from FIG. 15 by subtracting EOT contribution from different HKs) onset is almost independent of the dielectric although HfSiO seems have a little bit smaller $TSiO_2$ onset. Curvature ($V_{fb}$ roll-off) starts at $TSiO_2$ around 1.5 nm. The degree of $V_{fb}$ roll-off (the slope for low EOTs) is dependent on the dielectric and HfSiO shows less $V_{fb}$ roll-off

At standard thermal budget (1030.degree. C. spike anneal), the effective workfunction (EWF) roll-off is found to be independent of the interfacial layer (IL) type as shown also in FIG. 14. In FIG. 14 the effective workfunction (EWF) is plotted in function of the effective oxide thickness (EOT) for a high-k/metal gate stack comprising a HfSiON high-k dielectric layer. The gate stack further comprises an RTO (rapid thermal oxidation) oxide as interfacial layer (IL) or a chemical oxide (slant oxide). Furthermore also a capping layer may be added such as AlO. This effect (the independency of effective workfunction (EWF) roll-of to the interfacial layer (IL)) is further observed with different high-k (HK) materials (FIG. 19). The benefit from $Al_2O_3$ capping is lost due to serious EWF roll-off (FIG. 14) at low EOT. Different EWFs are observed between metals (FIGS. 11, 15-16). However, EWF roll-off trends are observed for different metal precursors (FIG. 15), MG thicknesses (FIG. 16), and post MG annealing (FIG. 11).

Figure 17:
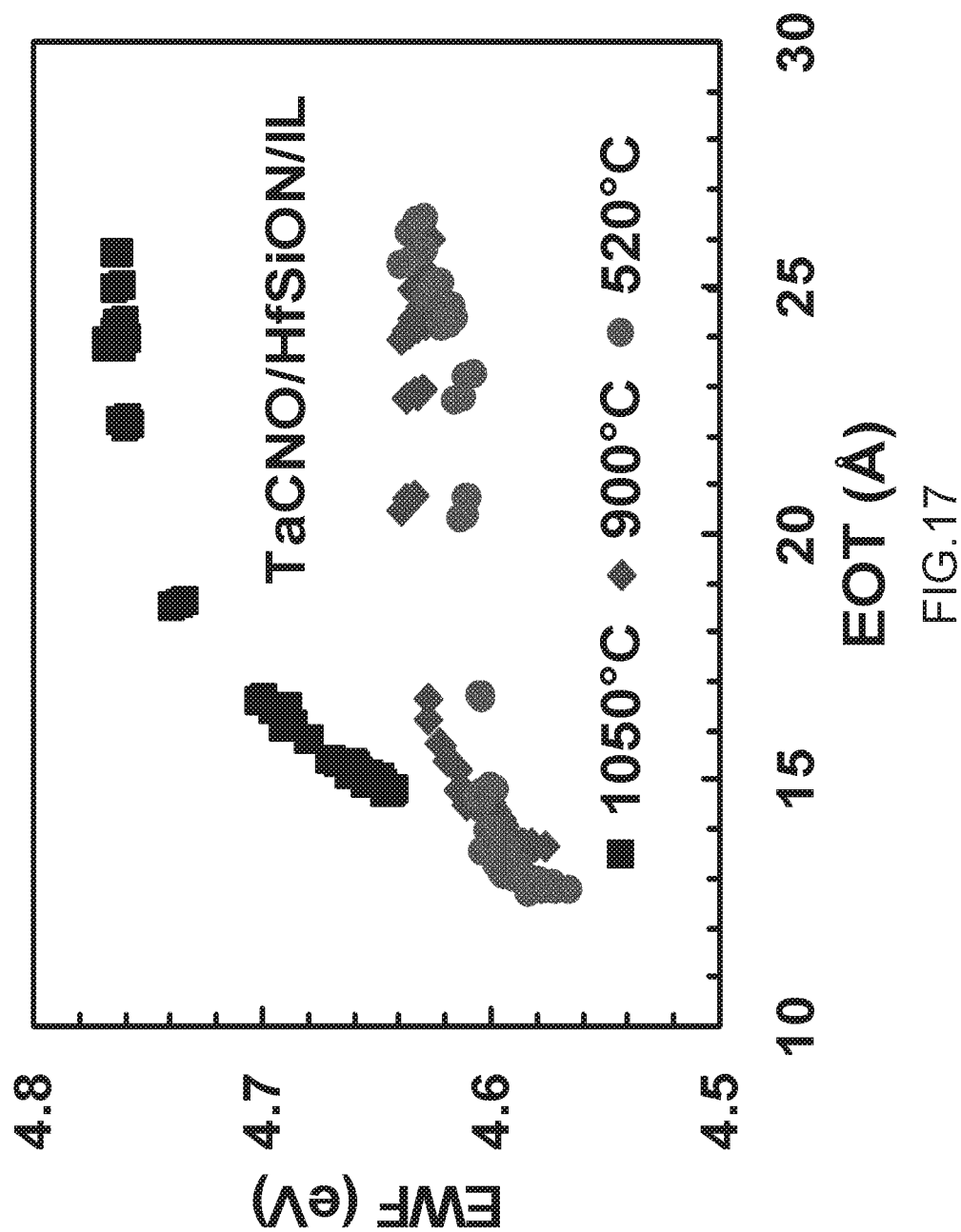
FIG. 17 shows experimental results for the effective work function (EWF) in function of the effective oxide thickness (EOT) for different thermal budgets of PMA. Much smaller, but present, $V_{fb}$ roll-off effect is observed at temperatures lower than or equal to 900 degrees Celsius. Low temperature activation gives EWF around midgap EWF for TaCNO. EWF increases for temperatures higher than 900 degrees Celsius and $V_{fb}$ roll-off become obvious at the same time.
Figure 18:
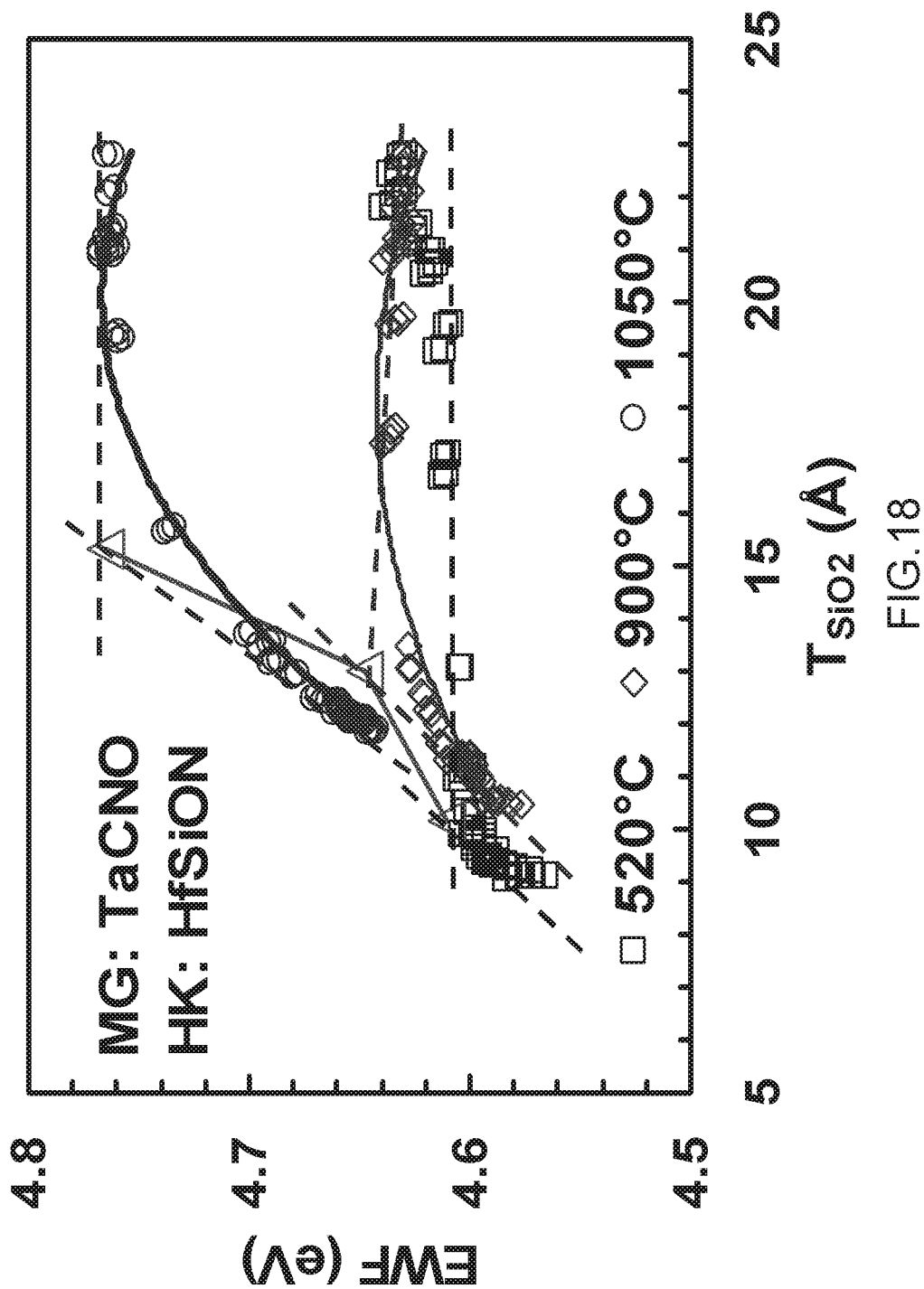
FIG. 18 shows experimental results for the effective work function (EWF) in function of the physical $SiO_2$ thickness ($TSiO_2$). $TSiO_2$ onset (triangles) increases with increasing temperature. A diffusion process is involved with thermal budget.
Figure 20:
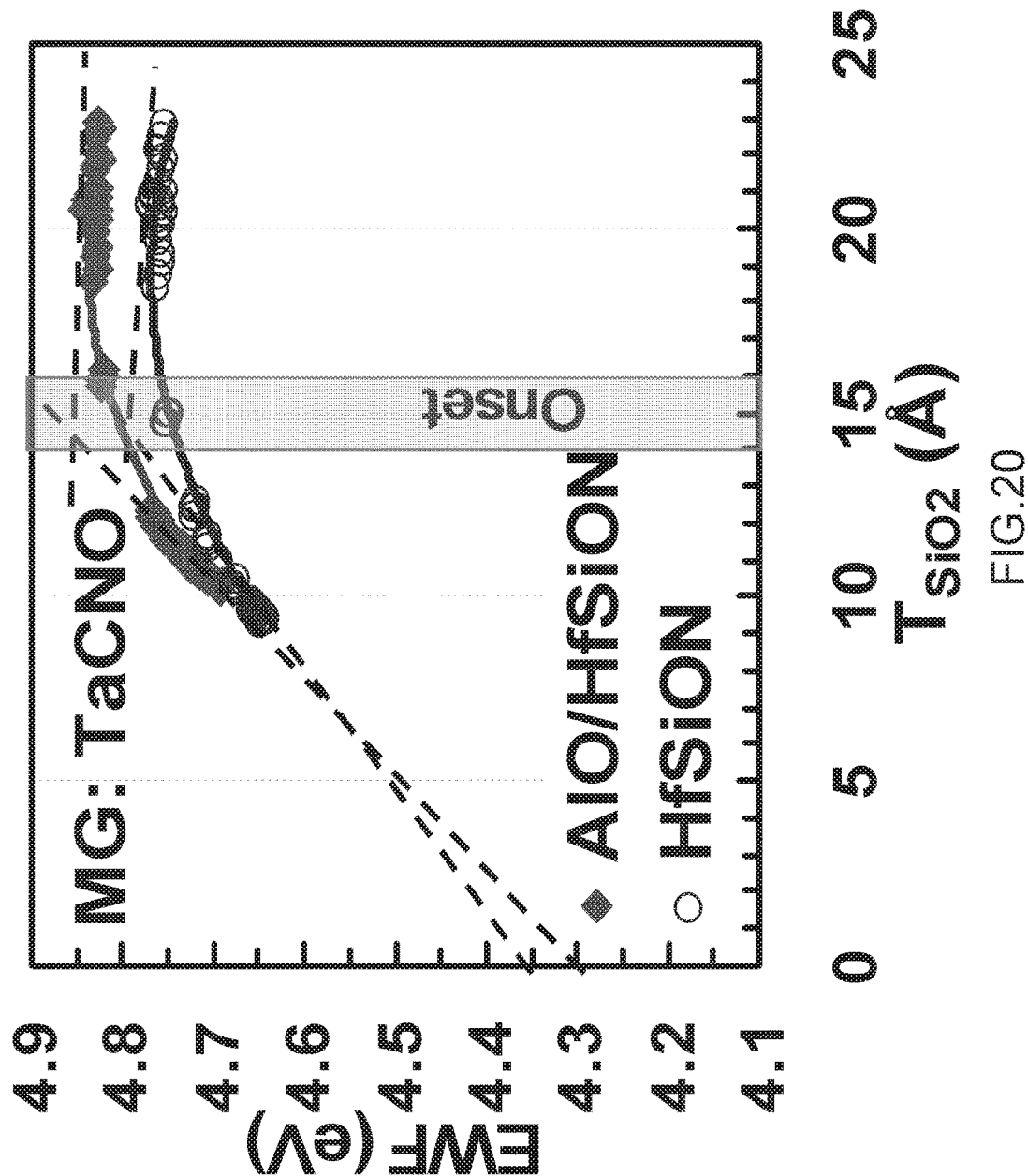
FIG. 20 shows experimental results for the effective work function (EWF) in function of the physical $SiO_2$ thickness ($TSiO_2$). With $Al_2O_3$ cap, the $TSiO_2$ onset is about 1.5 nm, which is similar to HK without $Al_2O_3$ cap. Extrapolation to $TSiO_2=0$ gives a pinning value of .about.4.3 eV for high thermal budget splits.

The EWF roll-off is thermally activated (FIG. 17) with stronger EWF roll-off for higher thermal budgets. However, a minor roll-off is observed already for 520.degree. C. forming gas annealing only. That means gate-last approach could also suffer from EWF roll-off issue in an even lower EOT region. The EWF roll-off behavior starts at a critical physical $SiO_2$ thickness, $T_{SiO2}$ onset, which increases with increasing temperature (FIG. 18). It is around 1.5 nm for different HKs after spike annealing (FIGS. 19-20). HfSiO shows less EWF roll-off effect.

Figure 21:
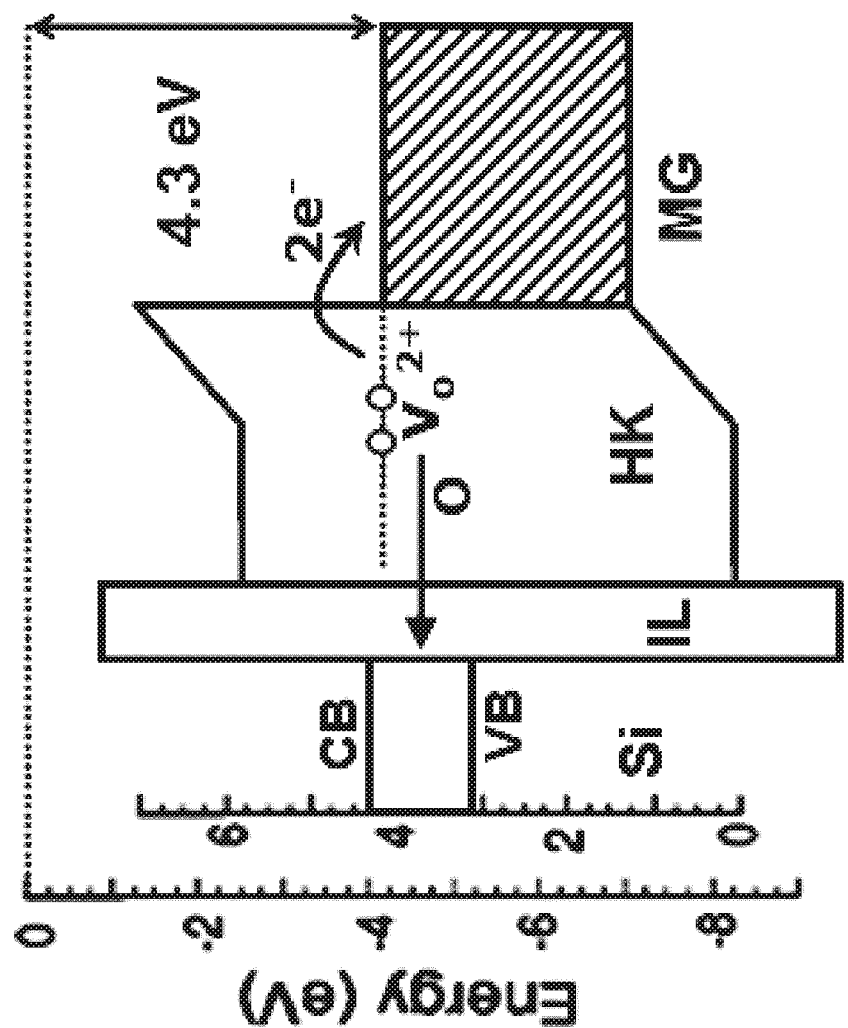
FIG. 21 shows an energy band diagram for oxygen diffusion from HK to Si. Current results are well explained by oxygen vacancy model. EWF gets pinned at the energy level of the oxygen vacancy, 4.0 eV from the $HfO_2$ valence band (VB). That is around 4.3 eV for EWF.

These observations can be successfully matched to the oxygen vacancy model (FIG. 21): oxygen diffusion from the $HfO_2$ to the Si and capture by the high EWF metal of released electrons from the reaction $O_{O+1/2}Si=V_O^{2+}+1/2 SiO_2+2\ e^-$. The EWF is pinned at the $V_O$ defect energy level at around 4.3 eV, which is consistent with current results (FIG. 20). That also explains the loss of $Al_2O_3$ EWF increase effect due to such extrinsic pining state. Since oxygen diffusion is involved, the reaction is IL thickness and thermal budget dependent (FIG. 19). Originally, $HfO_2$ is more thermally stable than $SiO_2$ but oxygen-deficient SiOx layer between $SiO_2$ and Si substrate might become more active to catch oxygen from HK below a critical IL thickness, .about.1.5 nm during spike annealing in FIGS. 19-20.

Figure 22:
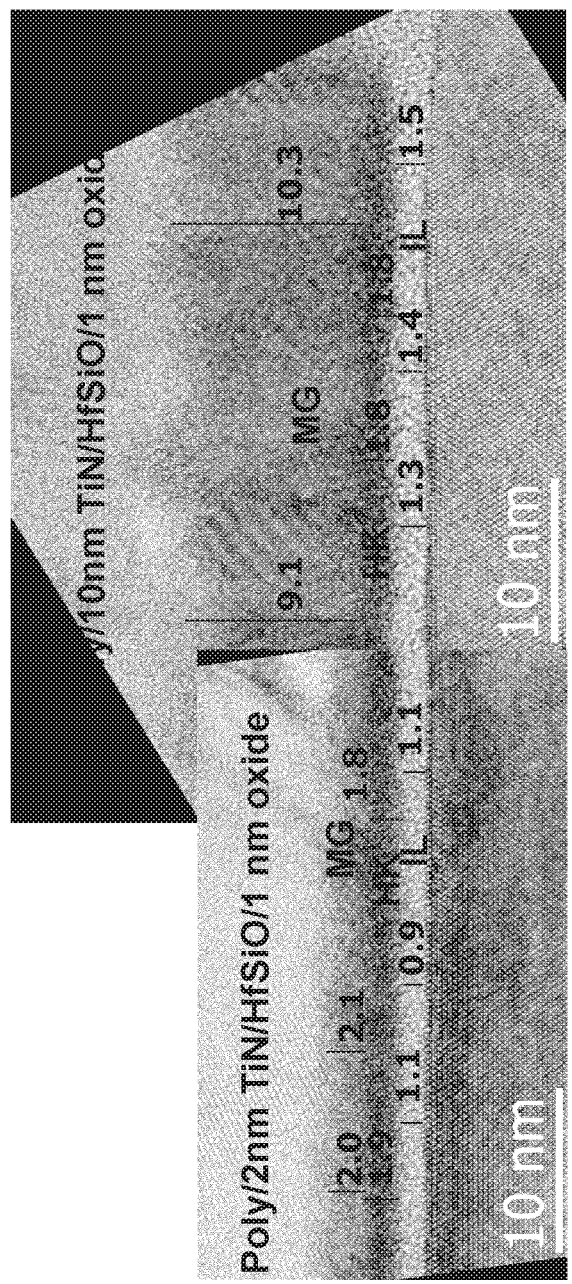
FIG. 22 shows TEM images for a MG gate stack. From TEM analysis, IL grows thicker as TiN thickness is increased. A thinner oxidation layer on top of TiN is expected during wafer transfer from MG tool to poly tool. Sufficient oxygen atoms diffuse from top of columnar MG through HK into IL for re-growth during spike annealing. Therefore, higher EWF with thicker MG could be also explained form oxygen rich condition causing less oxygen vacancy in HK and more Ti—O—Hf bonding between HK and MG interface.

Sufficient oxygen from thicker MG leads to IL re-growth (FIG. 22) and release oxygen vacancy pining effect in HK so higher EWF is obtained (FIG. 16). Guidelines to the PMOS EWF roll-off issue therefore includes: 1) reduction of the oxygen vacancy density by dielectric quality improvements, 2) removal of unwanted diffusion processes and 3) passivation of existing oxygen vacancies.

Solutions for EWF Roll-Off

Figure 23:
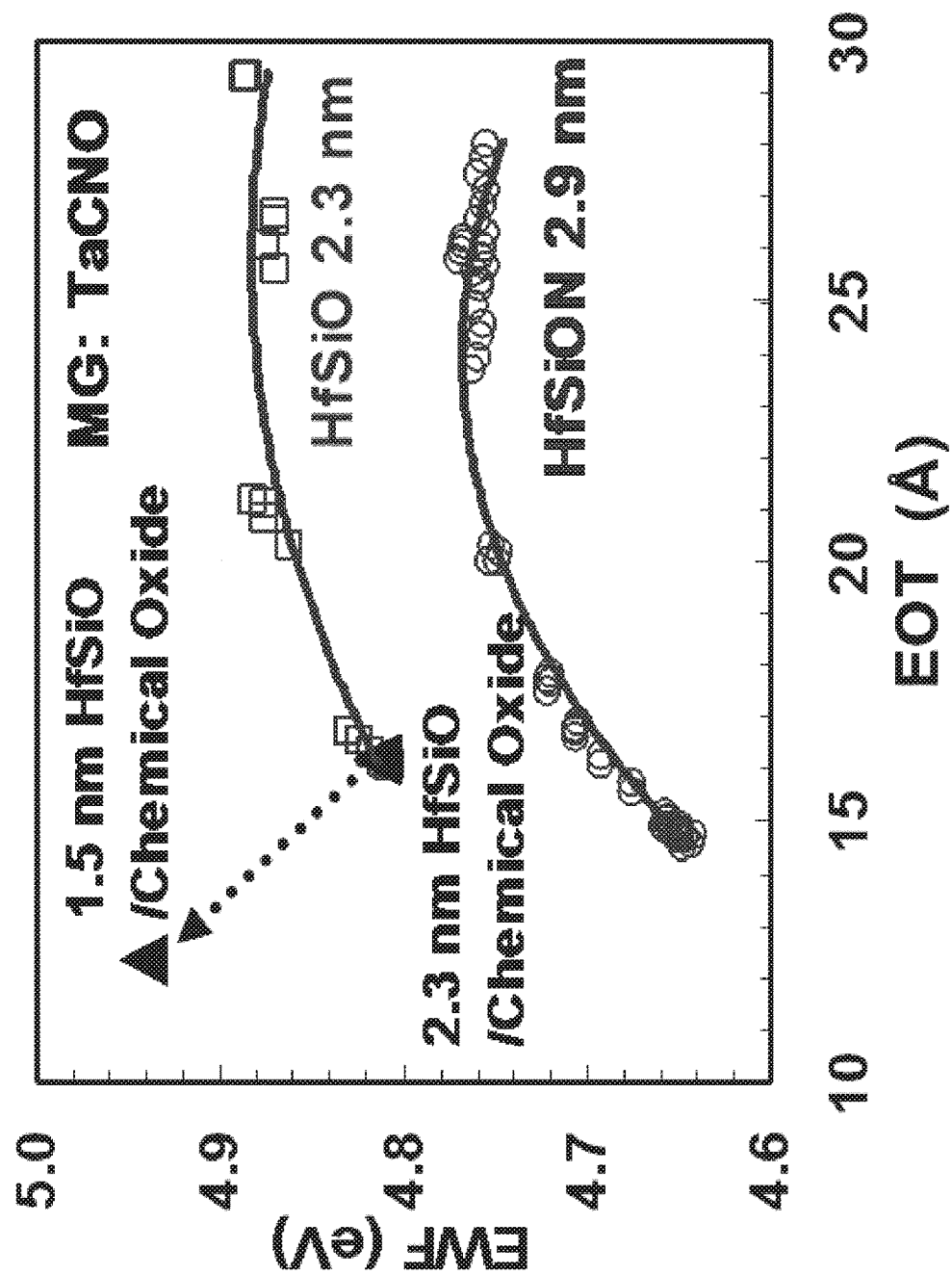
FIG. 23 shows experimental results for the effective work function (EWF) in function of the effective oxide thickness (BUT) for different high-k dielectric thickness. Thinner HK with less oxygen vacancy leads to higher EWF.
Figure 24:
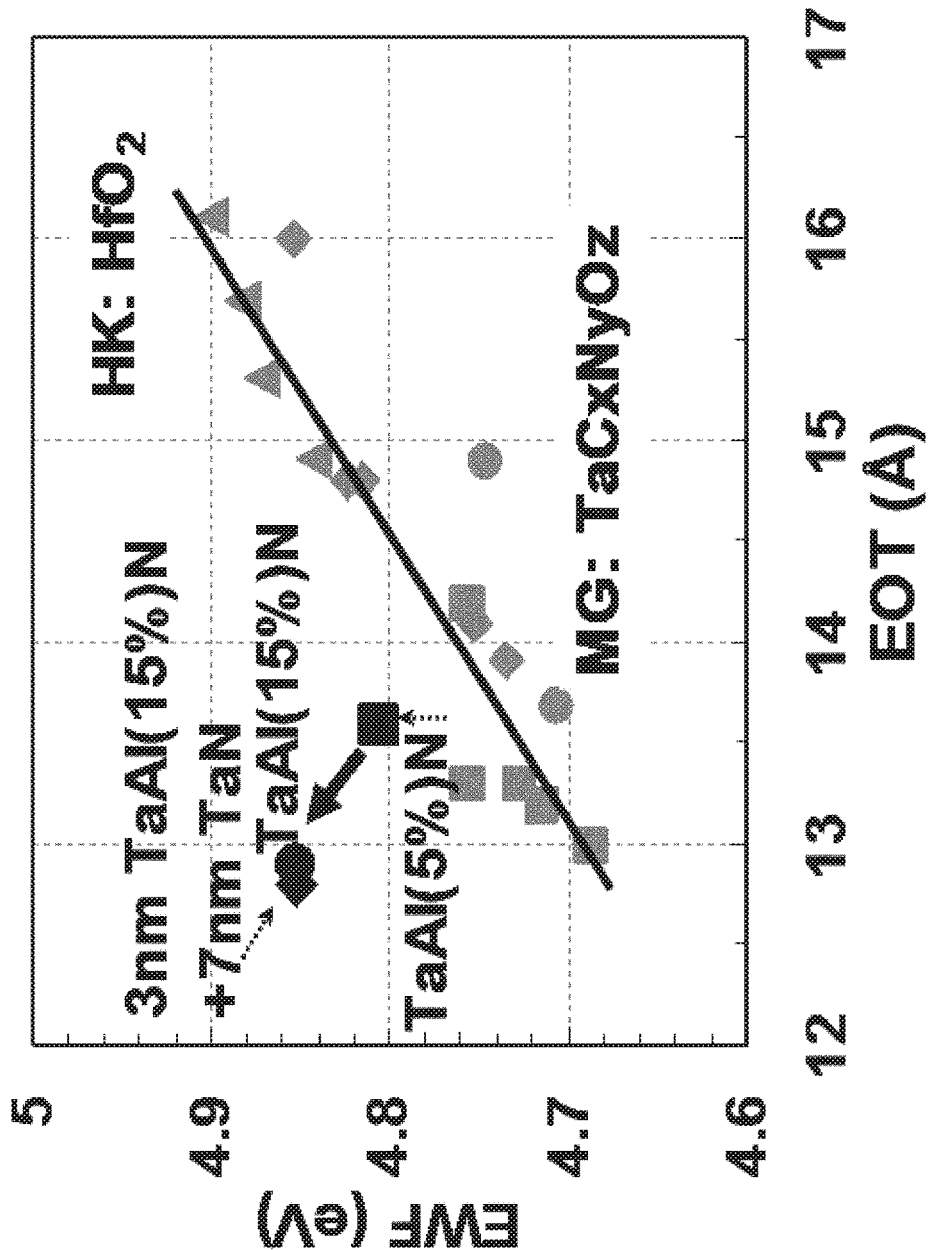
FIG. 24 shows experimental results for the effective work function (EWF) in function of the effective oxide thickness (EOT) for bilayer MG. Al in TaN MG leads to EOT reduction with EWF increase due to Al—O bonding between HK and MG interface. Al in MG traps oxygen in HK by Al—O bonding. 7 nm TaN/3 nm TaAl (15%)N bi-layer MG could have the same effect with lower resistivity.
Figure 25:
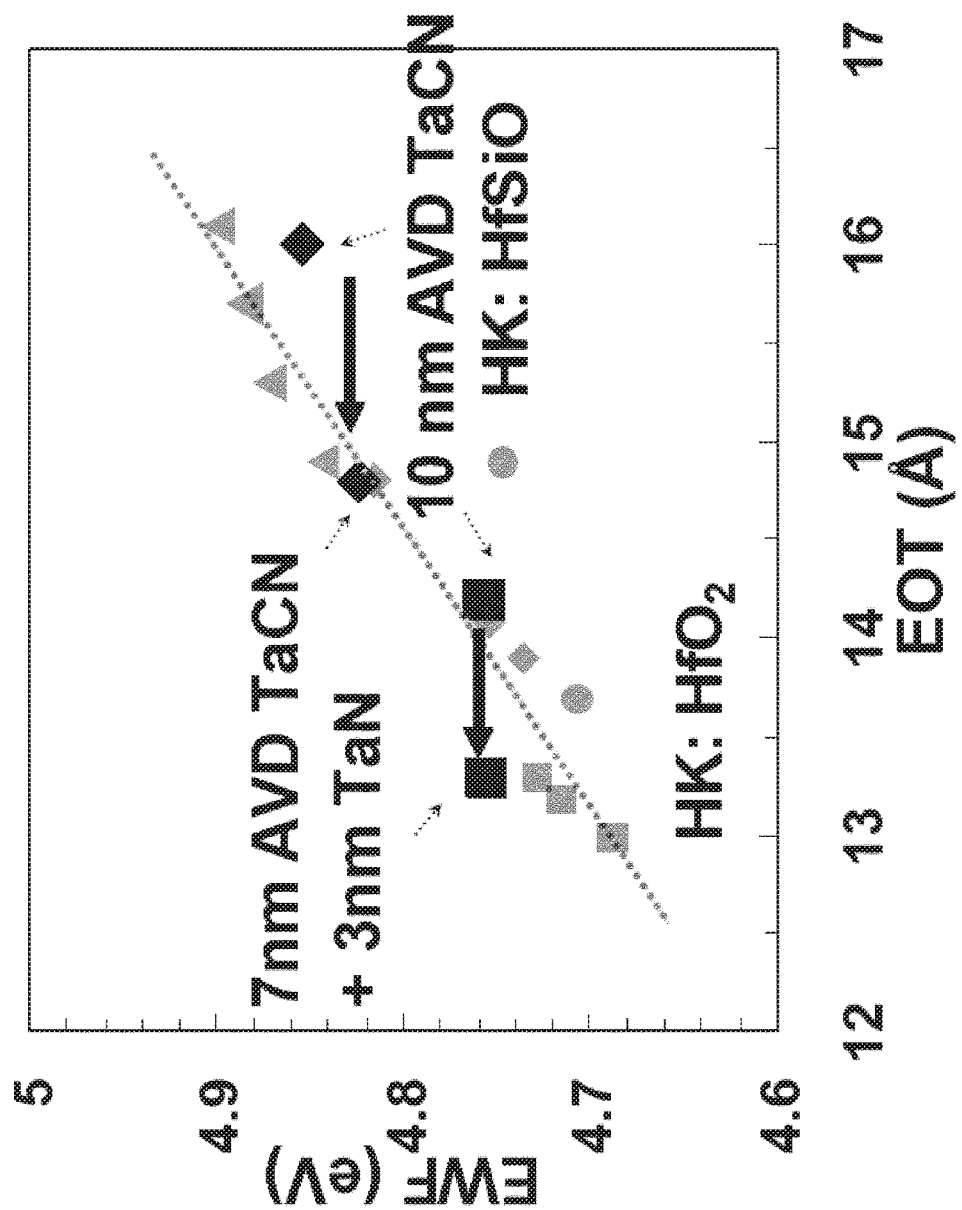
FIG. 25 shows experimental results for the effective work function (EWF) in function of the effective oxide thickness (EOT) for a multilayer MG. In-situ cap 3 nm AVD TaN on 7 nm AVD TaCN MG successfully blocks oxygen diffusion path and thus leads to EOT reduction without EWF penalty. AVD TaN MG has higher density compared to that of TaCN.
Figure 26:
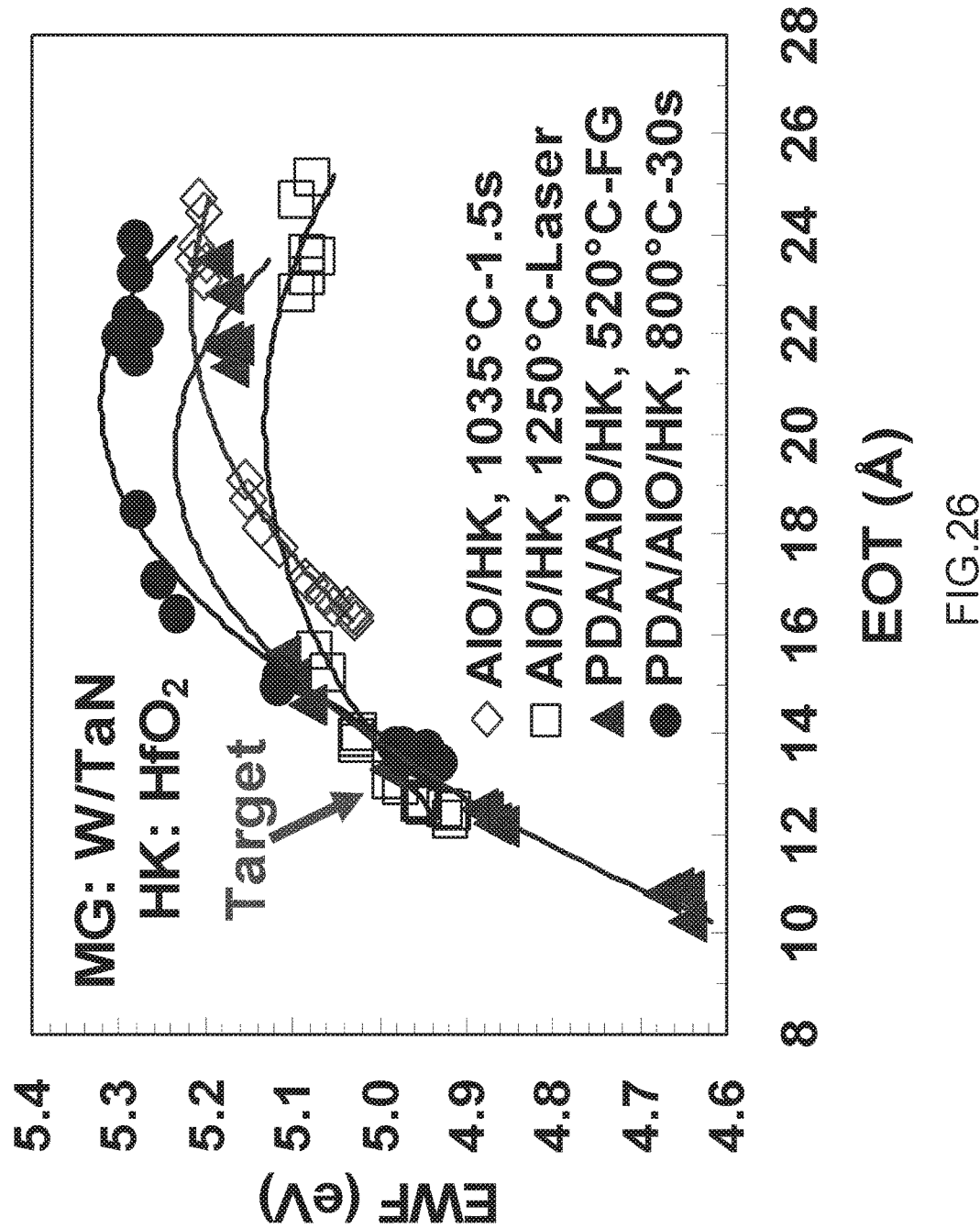
FIG. 26 shows experimental results for the effective work function (EWF) in function of the effective oxide thickness (EOT). PMOS band edge EWF of 5.0 eV, at 1.3 nm EOT is demonstrated by a laser annealing approach with full MG or PDA with low thermal budget approach (520 degrees Celsius forming gas (FG) annealing or rapid thermal annealing (RTA) 800 degrees Celsius for 30 seconds).
Figure 27:
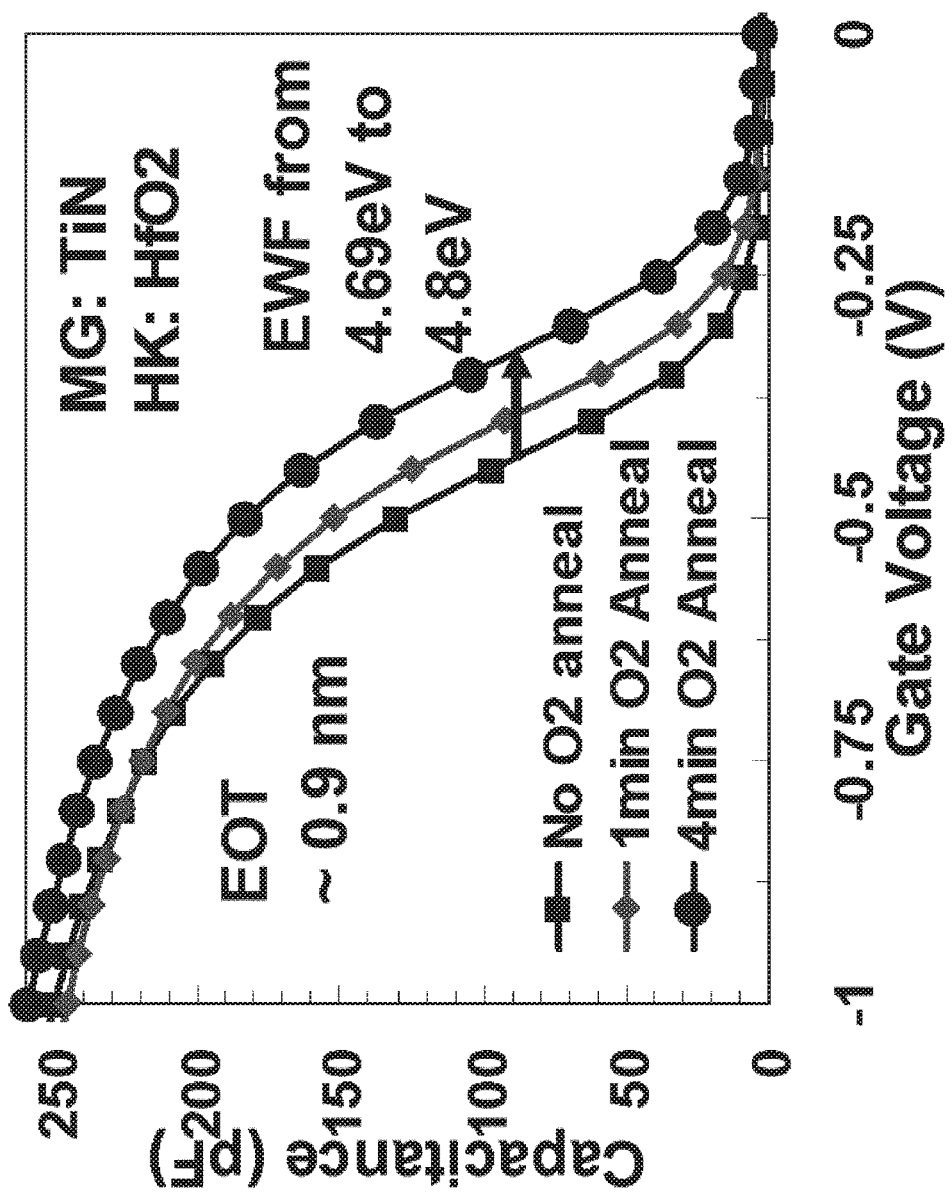
FIG. 27 shows experimental results for the effective work function (EWF) in function of the effective oxide thickness (BUT). EWF is further increased, 110 mV, by introducing low temperature (LT, temperature less than 350 degrees Celsius) $O_2$ annealing after spike annealing without EOT increase penalty.
Figure 28:
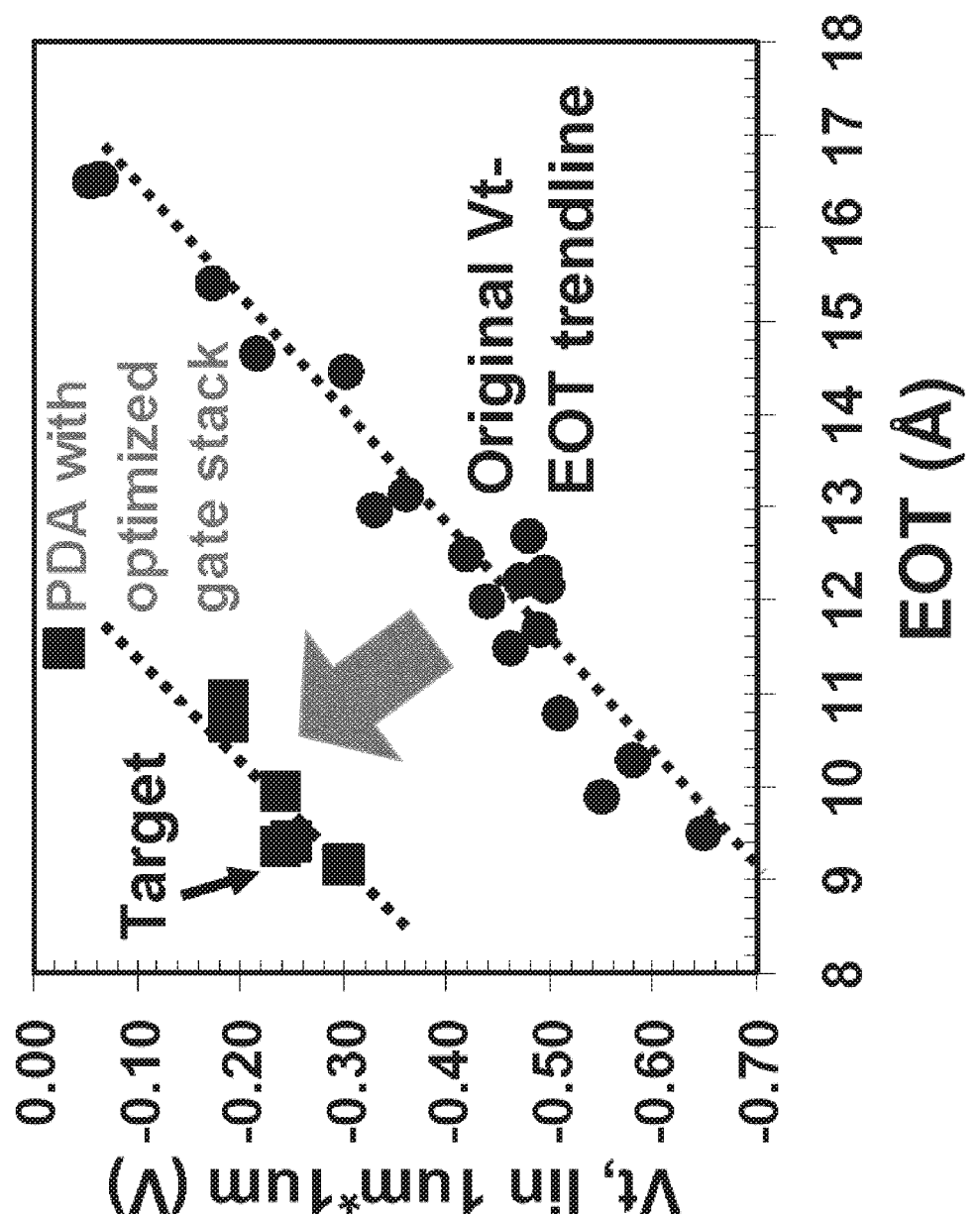
FIG. 28 shows experimental results for the effective work function (EWF) in function of the effective oxide thickness (EOT) achieving −0.25 V PMOS threshold voltage target by using PDA with optimized gate stack.
Figure 29:
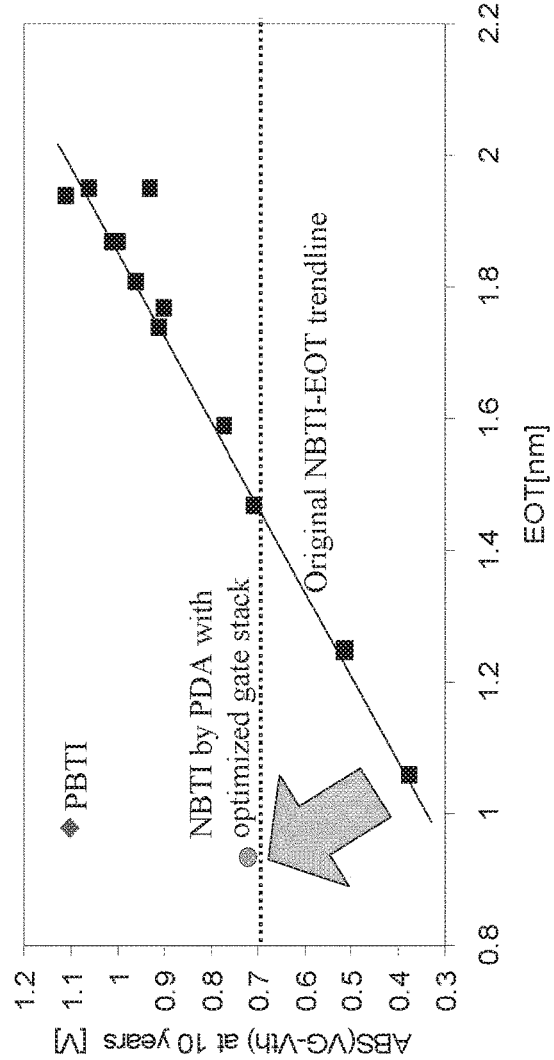
FIG. 29 and FIG. 30 show experimental results for the effective work function (EWF) in function of the effective oxide thickness (EOT) proving increased negative bias temperature instability (NBTI). By PDA on optimized gate stack, NBTI can pass 10 years life time at EOT less than 1 nm. There is no problem for positive bias temperature instability (PBTI) in sub 1 nm EOT region.
Figure 30:
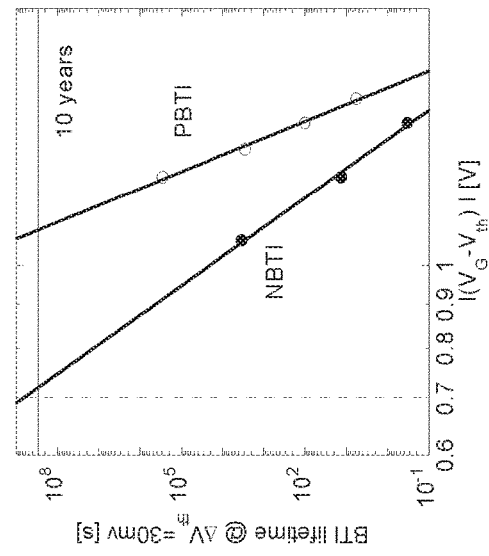

Less oxygen vacancies for HfSiO (FIG. 22) or thinner HK (FIG. 23) reduces the EWF roll-off. PDA (post dielectric annealing) on $Al_2O_3$/HK improves dielectric quality resulting in EOT reduction without EWF decrease (FIG. 10). The same thermal budget on MG (PMA) results in increasing EWF (FIG. 11), but at an increase in IL thickness from TEM observation. MG is the major oxygen source for IL re-growth during annealing. Al in MG (FIG. 24) or multilayer MG (FIG. 25) could control the direction of the oxygen diffusion and therefore improve the EWF roll-off. By freezing the unwanted diffusion process, PMOS band edge EWF, 5.0 eV, at 1.3 nm EOT is achieved by laser annealing with full MG or by PDA with low thermal budget approach (FIG. 26). The EWF is further increased by 110 mV without any EOT increase at 0.9 nm (FIG. 27), by introducing low temperature (LT) $O_2$ annealing to repair oxygen vacancies which present after spike annealing. By following this guideline, PMOS $V_t$ at 0.25V with EOT at nm is demonstrated (FIG. 28) The PDA is also critical to reach NBTI requirement for PMOS with EOT less than 1 nm (FIG. 29 and FIG. 30).

Low $V_t$ CMOS Integration for EOT Less than 1 nm

Figure 31:
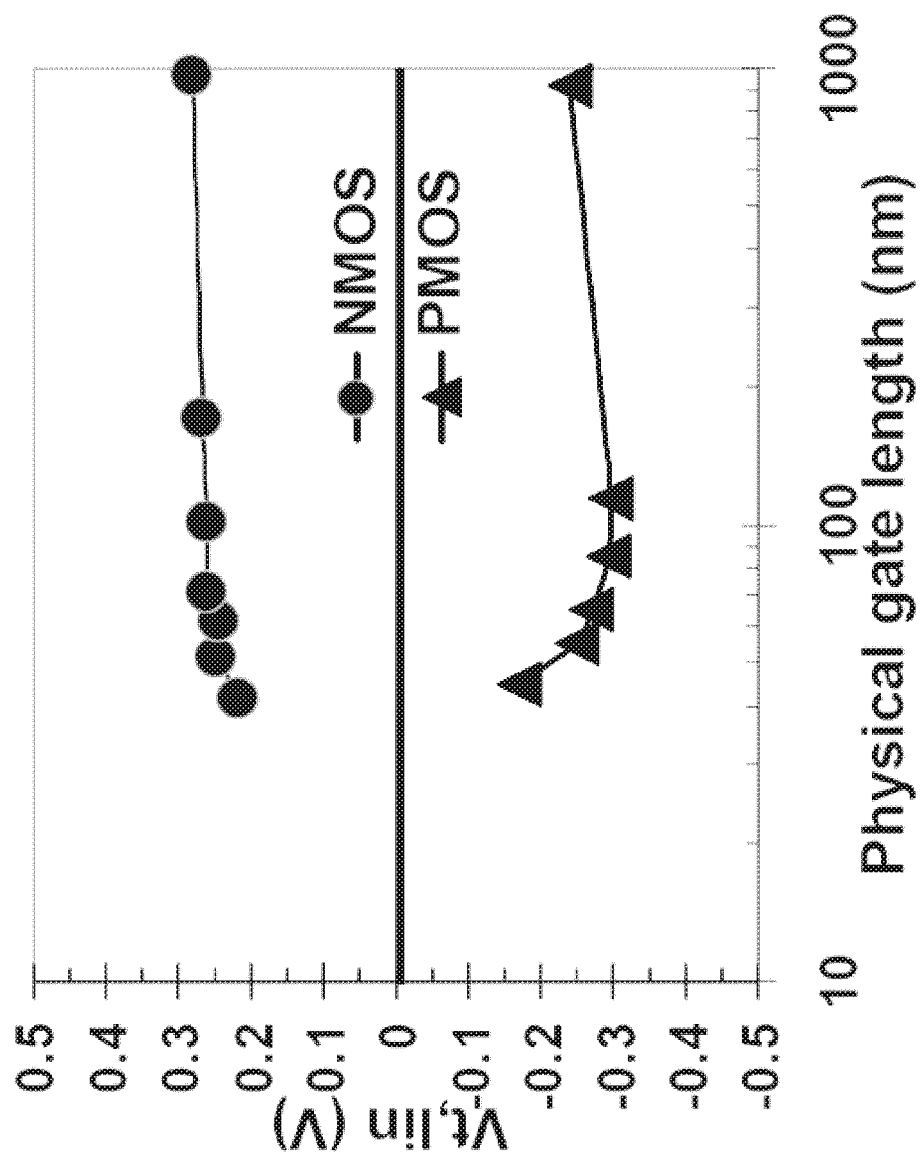
FIG. 31 shows $V_t$-gate length roll-off for best PMOS EOT data and best NMOS EOT data in function of the physical gate length for 22 nm high performance CMOS and beyond.
Figure 32:
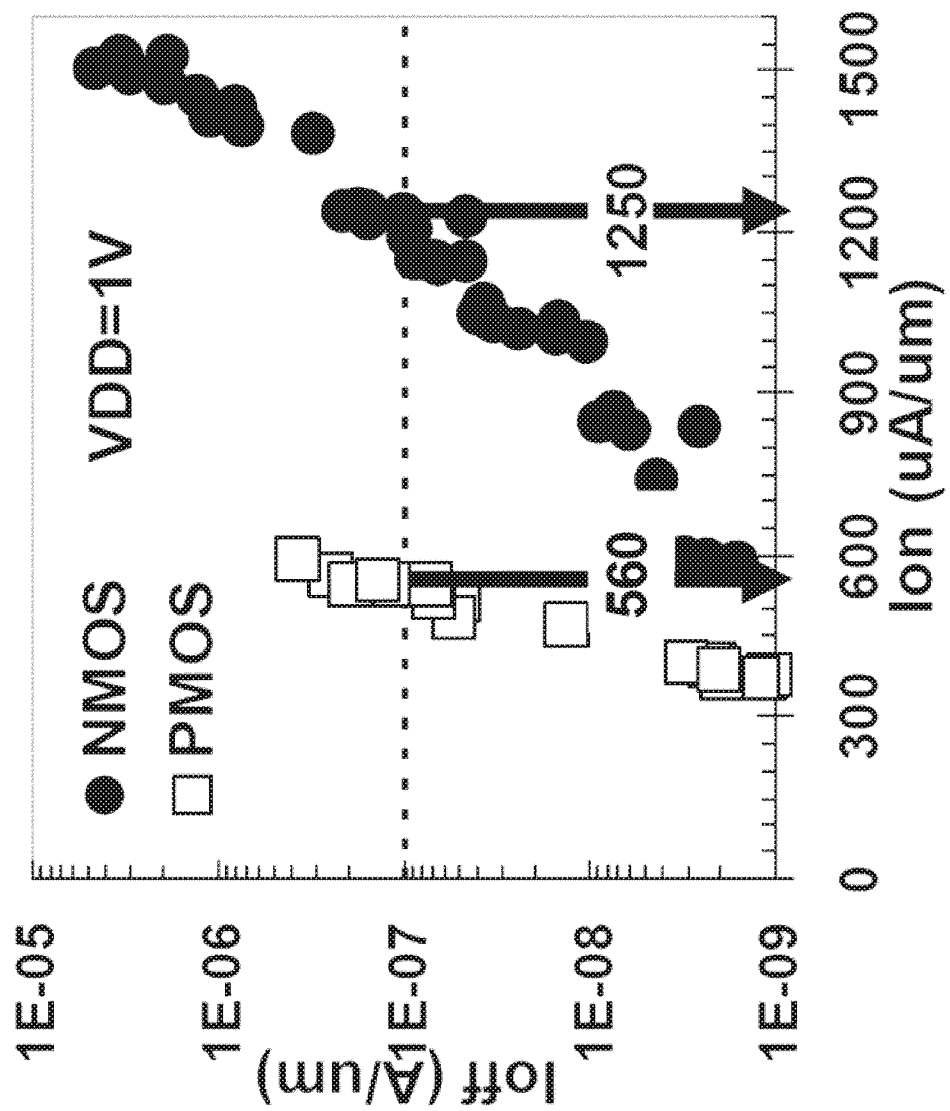
FIG. 32 shows Ion-Ioff or Ion-Jg for best PMOS EOT data and best NMOS EOT data for 22 nm high performance CMOS and beyond.
Figure 33:
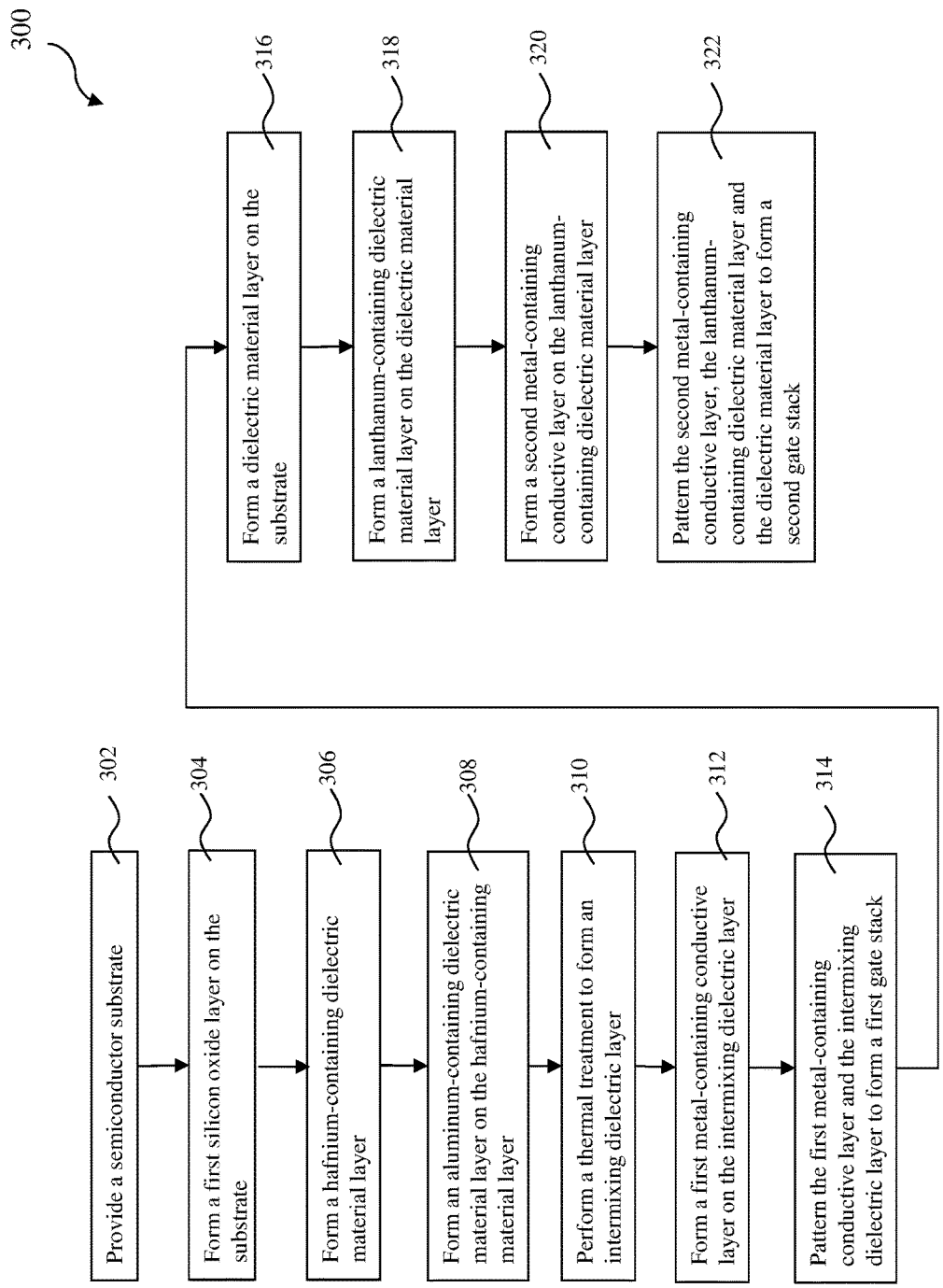
FIG. 33 is a flowchart of a method to form gate stacks.

By using a production worthy gate-first transistor flow, PMOS solutions could also be implemented to reach CMOS low Vt (±0.25V) at sub 1 nm EOT excellent $I_{on}$ performance for 22 nm CMOS technology and beyond (FIGS. 31-32).

According to embodiments certain inventive aspects a high performance CMOS device is obtained with a threshold voltage lower than about 0.25 V, an effective oxide thickness (EOT) lower than about 1 nm and as such high mobility and good reliability.

It is an advantage of embodiments of certain inventive aspects that a dual work function semiconductor device may be manufactured using a simplified integration scheme and a minimum of process steps. It is a further advantage of certain embodiments that a dual work function semiconductor device may be manufactured down to 22 nanometer technology node or below.

It is an advantage of embodiments of certain inventive aspects that negative bias temperature instability (NBTI) reliability may be enhanced beyond 10 years lifetime.

The foregoing description details certain embodiments of certain inventive aspects. It will be appreciated, however, that no matter how detailed the foregoing appears in text, inventive aspects may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method, comprising:
   receiving a substrate having an insulating feature, the substrate having a first region and a second region separated by the insulating feature,
   forming a first gate stack having a first work function on the substrate within the first region, wherein forming of the first gate stack includes:
      forming a first hafnium-containing dielectric material layer on the substrate,
      forming an aluminum-containing dielectric material layer on the first hafnium-containing dielectric material layer,
      performing a thermal treatment to intermix the first hafnium-containing dielectric material layer and the aluminum-containing dielectric material layer while the first hafnium-containing dielectric material layer and the aluminum-containing dielectric material layer cover the insulating feature and continuously extend from the first region to the second region over the insulating feature, resulting in an intermixing dielectric layer,
      after the thermal treatment, forming a first metal-containing conductive layer on the intermixing dielectric layer, and
      patterning the intermixing dielectric layer and the first metal-containing conductive layer, thereby forming the first gate stack in the first region; and
   after forming the first gate stack, forming a second gate stack having a second work function less than the first work function on the substrate, wherein forming of the second gate stack includes:
      forming a second hafnium-containing dielectric material layer,
      forming a lanthanum-containing dielectric material layer on the second hafnium-containing dielectric material layer,
      forming a second metal-containing conductive layer on the lanthanum-containing dielectric material layer, and
      patterning the second hafnium-containing dielectric material layer, the lanthanum-containing dielectric material layer and the second metal-containing conductive layer, thereby forming the second gate stack in the second region.

2. The method of claim 1, wherein the thermal treatment is selected to increase the first work function and decrease an equivalent oxide thickness (EOT) of the intermixing dielectric layer.

3. The method of claim 2, wherein the thermal treatment is selected such that the first work function of the first gate stack is tuned to a range between 4.7 eV and 5.2 eV.

4. The method of claim 2, wherein the thermal treatment is selected such that an EOT of a gate dielectric layer of the first gate stack is tuned to be less than 2 nm, and wherein the gate dielectric layer includes the intermixing dielectric layer.

5. The method of claim 1, wherein the thermal treatment is performed in an ambient with at least one of argon and nitrogen.

6. The method of claim 1, wherein the thermal treatment is performed at a temperature range between 800 degrees Celsius and 1300 degrees Celsius and during a time period ranging between 0.1 second and 30 seconds.

7. The method of claim 1, further comprising performing a spike annealing at a temperature of at least 1035 degrees Celsius after the thermal treatment.

8. The method of claim 1, further comprising:
   forming a silicon oxide layer between the substrate and the first hafnium-containing dielectric material layer.

9. The method of claim 8, wherein the thermal treatment intermixes the silicon oxide layer, the hafnium-containing dielectric material layer and the aluminum-containing dielectric material layer to form the intermixing dielectric layer containing hafnium, aluminum, silicon and oxygen.

10. The method of claim 1, wherein
    the first metal-containing conductive layer includes a first metal-containing conductive material selected from nickel (Ni), ruthenium oxide (RuO), and molybdenum nitride (MoN); and
    the second metal-containing conductive layer includes a second metal-containing conductive material selected from ruthenium (Ru), zirconium (Zr), niobium (Nb), tantalum (Ta), and titanium silicide ($TiSi_2$).

11. The method of claim 1, wherein the performing of the thermal treatment causes regrowth while the first hafnium-containing dielectric material layer and the aluminum-containing dielectric material layer are overlapped with and covering the insulating feature.

12. A method, comprising:
    receiving a substrate having an insulating feature, the substrate having a first region and a second region separated by the insulating feature;
    forming a first silicon oxide layer on the substrate;
    forming a first hafnium-containing dielectric material layer on the first silicon oxide layer;
    forming an aluminum-containing dielectric material layer on the first hafnium-containing dielectric material layer;
    performing a thermal treatment to intermix the first silicon oxide layer, the first hafnium-containing dielectric material layer and the aluminum-containing dielectric material layer while the first silicon oxide layer, the first hafnium-containing dielectric material layer, and the aluminum-containing dielectric material layer cover the insulating feature and continuously extend from the first region to the second region over the insulating feature, resulting in an intermixing dielectric layer containing hafnium, aluminum, silicon, and oxygen;
    forming a first metal-containing conductive layer on the intermixing dielectric layer;

patterning the first metal-containing conductive layer and the intermixing dielectric layer, thereby forming a first gate stack in the first region; and forming a second gate stack in the second region.

13. The method of claim 12, wherein forming of the second gate stack further includes:
    forming a second silicon oxide layer on the substrate and on the first gate stack;
    forming a second hafnium-containing dielectric material layer on the second silicon oxide layer;
    forming a lanthanum-containing dielectric material layer on the second hafnium-containing dielectric material layer,
    forming a second metal-containing conductive layer on the lanthanum-containing dielectric material layer, and
    patterning the second silicon oxide layer, the second hafnium-containing dielectric material layer, the lanthanum-containing dielectric material layer and the second metal-containing conductive layer, thereby forming the second gate stack in the second region, wherein the first gate stack has a first work function and the second gate stack has a second work function less than the first work function.

14. The method of claim 12, wherein the thermal treatment is designed to tune the first work function to a range between 4.7 eV and 5.2 eV, and to adjust an equivalent oxide thickness (EOT) of the intermixing dielectric layer to be less than 2 nm.

15. The method of claim 12, further comprising performing a spike annealing process at a temperature of at least 1035 degrees Celsius after the thermal treatment.

16. The method of claim 12, wherein
    the first metal-containing conductive layer includes a first metal-containing conductive material selected from nickel (Ni), ruthenium oxide (RuO), and molybdenum nitride (MoN); and
    the second metal-containing conductive layer includes a second metal-containing conductive material selected from ruthenium (Ru), zirconium (Zr), niobium (Nb), tantalum (Ta), and titanium silicide ($TiSi_2$).

17. A method, comprising:
    receiving a substrate having an insulating feature, the substrate having a first region and a second region separated by the insulating feature;
    forming a first gate stack having a first work function on the substrate within the first region, wherein forming of the first gate stack includes:
        forming a first silicon oxide layer on the substrate;
        forming a hafnium-containing dielectric material layer on the silicon oxide layer;
        forming an aluminum-containing dielectric material layer on the hafnium-containing dielectric material layer;
        performing a thermal treatment to intermix the first silicon oxide layer, the hafnium-containing dielectric material layer and the aluminum-containing dielectric material layer while the first silicon oxide layer, the hafnium-containing dielectric material layer, and the aluminum-containing dielectric material layer cover the insulating feature and continuously extend from the first region to the second region over the insulating feature, resulting in an intermixing dielectric layer containing hafnium, aluminum, silicon, and oxygen;
        forming a first metal-containing conductive layer on the intermixing dielectric layer, and
        patterning the first metal-containing conductive layer and the intermixing dielectric layer and, thereby forming the first gate stack in the first region; and
    thereafter, forming a second gate stack having a second work function less than the first work function on the substrate within the second region, wherein forming of the second gate stack includes:
        forming a second silicon oxide layer,
        forming a high-k dielectric material layer on the second silicon oxide layer,
        forming a lanthanum-containing dielectric material layer on the high-k dielectric material layer,
        forming a second metal-containing conductive layer on the lanthanum-containing dielectric material layer, and
        patterning the second silicon oxide layer, the high-k dielectric material layer, the lanthanum-containing dielectric material layer and the second metal-containing conductive layer, thereby forming the second gate stack in the second region.

18. The method of claim 17, wherein the thermal treatment is selected such that the first work function of the first gate stack is tuned to a range between 4.7 eV and 5.2 eV.

19. The method of claim 17, wherein
    the first metal-containing conductive layer includes one of nickel (Ni), ruthenium oxide (RuO), and molybdenum nitride (MoN); and
    the second metal-containing conductive layer includes one of ruthenium (Ru), zirconium (Zr), niobium (Nb), tantalum (Ta), and titanium silicide ($TiSi_2$).

20. The method of claim 17, wherein the high-k dielectric material layer includes hafnium (Hf).

* * * * *